United States Patent
Lim et al.

(10) Patent No.: US 10,170,676 B2
(45) Date of Patent: Jan. 1, 2019

(54) LIGHT EMITTING DEVICE PACKAGE AND LIGHTING APPARATUS HAVING SAME

(71) Applicant: LG INNOTEK CO., LTD., Seoul (KR)

(72) Inventors: Chang Man Lim, Seoul (KR); Won Jung Kim, Seoul (KR); Hyoung jin Kim, Seoul (KR); Bong Kul Min, Seoul (KR); Ho Young Chung, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 15/699,900

(22) Filed: Sep. 8, 2017

(65) Prior Publication Data
US 2017/0373236 A1    Dec. 28, 2017

Related U.S. Application Data

(63) Continuation of application No. 15/293,029, filed on Oct. 13, 2016, now Pat. No. 9,793,457.

(30) Foreign Application Priority Data

Oct. 14, 2015  (KR) .......................... 10-2015-0143629
Sep. 23, 2016  (KR) .......................... 10-2016-0122480

(51) Int. Cl.
| | |
|---|---|
| *H01L 33/62* | (2010.01) |
| *H01L 23/495* | (2006.01) |
| *H01L 25/075* | (2006.01) |
| *H01L 25/16* | (2006.01) |
| *H01L 33/54* | (2010.01) |
| *H01L 33/60* | (2010.01) |
| *H01L 33/48* | (2010.01) |

(52) U.S. Cl.
CPC ........ *H01L 33/62* (2013.01); *H01L 23/49537* (2013.01); *H01L 23/49541* (2013.01);
(Continued)

(58) Field of Classification Search
CPC ......... H01L 33/18; H01L 33/24; H01L 33/26; H01L 33/54; H01L 33/60; H01L 33/62;
(Continued)

(56) References Cited

U.S. PATENT DOCUMENTS

| | | |
|---|---|---|
| 8,752,595 B2 | 6/2014 | Park |
| 8,981,415 B1 | 3/2015 | Hsu et al. |

(Continued)

FOREIGN PATENT DOCUMENTS

| | | |
|---|---|---|
| EP | 2595205 A2 | 5/2013 |
| JP | 2007-150229 A | 6/2007 |

(Continued)

*Primary Examiner* — Yosef Gebreyesus
(74) *Attorney, Agent, or Firm* — Birch, Stewart, Kolasch & Birch, LLP

(57) ABSTRACT

An embodiment relates to a light emitting device package and a lighting apparatus having the same. According to the embodiment, a light emitting device package includes a first lead frame; a second lead frame spaced apart from the first lead frame; a body coupled to the first lead frame and the second lead frame and includes a first cavity which exposes a portion of the upper surface of the first lead frame, a second cavity which exposes a portion of the upper surface of the second lead frame, and a spacer which is disposed between the first lead frame and the second frame; at least one light emitting device disposed in the first cavity; and a protection device disposed in the second cavity. The second cavity is disposed on a first inside surface of the first cavity and the first inside surface is connected to an upper surface of the spacer, and an area of a bottom surface of the first cavity is equal to or less than 40% of entire area of the body.

20 Claims, 15 Drawing Sheets

(52) U.S. Cl.
CPC .... *H01L 23/49575* (2013.01); *H01L 25/0753* (2013.01); *H01L 25/167* (2013.01); *H01L 33/54* (2013.01); *H01L 33/60* (2013.01); *H01L 33/486* (2013.01); *H01L 2224/48091* (2013.01); *H01L 2224/48247* (2013.01); *H01L 2224/48257* (2013.01)

(58) Field of Classification Search
CPC ............... H01L 33/105; H01L 33/486; H01L 2224/48091; H01L 2224/48247; H01L 2224/48257; H01L 25/0753; H01L 25/167; H01L 23/49537; H01L 23/49541; H01L 23/49575
See application file for complete search history.

(56) References Cited

U.S. PATENT DOCUMENTS

| | | | |
|---|---|---|---|
| 2003/0002820 A1 | 1/2003 | Nakanishi et al. | |
| 2009/0001392 A1* | 1/2009 | Lee | H01L 25/0753 257/89 |
| 2010/0102345 A1* | 4/2010 | Kong | H01L 33/486 257/98 |
| 2011/0012151 A1 | 1/2011 | Ono | |
| 2011/0303941 A1 | 12/2011 | Lee | |
| 2012/0112227 A1 | 5/2012 | Toyama | |
| 2012/0275186 A1 | 11/2012 | Min | |
| 2013/0121000 A1 | 5/2013 | Lee et al. | |
| 2013/0161668 A1 | 6/2013 | Mineshita | |
| 2014/0021491 A1* | 1/2014 | Meng | H01L 33/54 257/82 |
| 2015/0014731 A1 | 1/2015 | Park et al. | |

FOREIGN PATENT DOCUMENTS

| | | |
|---|---|---|
| JP | 2009-295892 A | 12/2009 |
| KR | 10-0604408 B1 | 7/2006 |
| KR | 10-2010-0096581 A | 9/2010 |
| KR | 10-2013-0005793 A | 1/2013 |
| KR | 10-2013-0054040 A | 5/2013 |
| KR | 10-2013-0098048 A | 9/2013 |
| KR | 10-2014-0128631 A | 11/2014 |

* cited by examiner

LIGHT EMITTING DEVICE PACKAGE AND LIGHTING APPARATUS HAVING SAME

CROSS-REFERENCE TO RELATED APPLICATIONS

This application is a Continuation of co-pending U.S. patent application Ser. No. 15/293,029 filed on Oct. 13, 2016, which claims priority under 35 U.S.C. 119 to Korean Patent Application No. 10-2015-0143629 filed on Oct. 14, 2015, and No. 10-2016-0122480 filed on Sep. 23, 2016, which are hereby incorporated by reference in its entirety.

BACKGROUND

Embodiments relate to a light emitting device package and a lighting apparatus having the same.

Light emitting devices, as a kind of semiconductor device which converts electric energy into light, are under the spotlight as next generation light sources which replace the conventional fluorescent lamps, incandescent lamps, or the like.

The light emitting diodes consume only the very low power compared to the incandescent lamps which generate light by heating tungsten or the fluorescent lamps which generate light by impacting ultraviolet rays generated through a high-voltage discharge on a fluorescent substance, since the light emitting diodes generate light using the semiconductor device.

Further, the light emitting diodes have a long service life, fast response characteristics, and environment-friendly features compared to the conventional light sources since the light emitting diodes generate light using a potential gap of the semiconductor device.

According to this, many studies have been conducted to replace the conventional light sources with the light-emitting diodes and the use of the light emitting diodes has been increased as the light sources of lighting apparatuses such as various lamps, liquid crystal display devices, billboards, and street lamps used in the indoor and the outdoor.

SUMMARY

The embodiments provide a light emitting device package which is capable of improving light extraction efficiency and a lighting apparatus having the same.

The embodiments provide a light emitting device package which is capable of improving luminous flux and a lighting apparatus having the same.

According to an embodiment, the light emitting device package includes a first lead frame; a second lead frame that is spaced apart from the first lead frame; a body that is coupled to the first lead frame and the second lead frame and includes a first cavity which exposes a portion of the upper surface of the first lead frame, a second cavity which exposes a portion of the upper surface of the second lead frame, and a spacer which is disposed between the first lead frame and the second frame; at least one light emitting device that is disposed in the first cavity; and a protection device that is disposed in the second cavity. The second cavity may be disposed on a first inside surface of the first cavity and the first inside surface may be connected to an upper surface of the spacer. An area of a bottom surface of the first cavity may be equal to or less than 40% of entire area of the body.

According to the embodiment, the light emitting device package includes the first cavity that exposes the first lead frame on which the light emitting device is mounted and the second cavity that exposes the second lead frame on which a protection device is mounted and the area of the exposed first lead frame has a range between 20% and 40% of an entire area of the body. Therefore, the embodiment may be capable of improving loss of light which is absorbed into the first lead frame.

In addition, in the light emitting device package of the embodiment, the area of the exposed second lead frame has a range between 3% and 10% of the entire area of the body. Therefore, the embodiment may be capable of minimizing the loss of light.

Further, in the light emitting device package of the embodiment, a curvature R of a fifth inside surface of the second cavity has a range between 0.1 mm and 0.3 mm. Therefore, the embodiment may be capable of improving the light extraction efficiency by improving a total reflection of light emitted from the light emitting device.

Further, in a light emitting device package according to another embodiment, a reflection molding portion covering the protection device is disposed in the second cavity and thus reflects light which is provided to the protection device and is lost. Therefore, the embodiment may be capable of further improving the light extraction efficiency.

Further, in a light emitting device package according to another embodiment, the reflection molding portion disposed on the protection device may extend to a wire bonding portion of the protection device which is positioned on a bottom surface of the first cavity on which the light emitting device is disposed. Therefore, the another embodiment may be capable of further improving the light extraction efficiency by reducing area of the lead frame exposed from the first cavity and reflecting light which is lost by the wire bonding portion and a wire.

DETAILED DESCRIPTION OF THE EMBODIMENTS

In the description of embodiments, in a case where each of layers (films), regions, patterns or structures is (are) formed "on/over" or "under" a substrate, each of layers (films), regions, pads or patterns, the "on/over" or the "under" includes a case where each of layers (films), regions, patterns or structures is (are) both "directly" and "with another layer being inserted therebetween (indirectly)" formed "on/over" or "under" a substrate, each of layers (films), regions, pads, or patterns.

Figure 1:
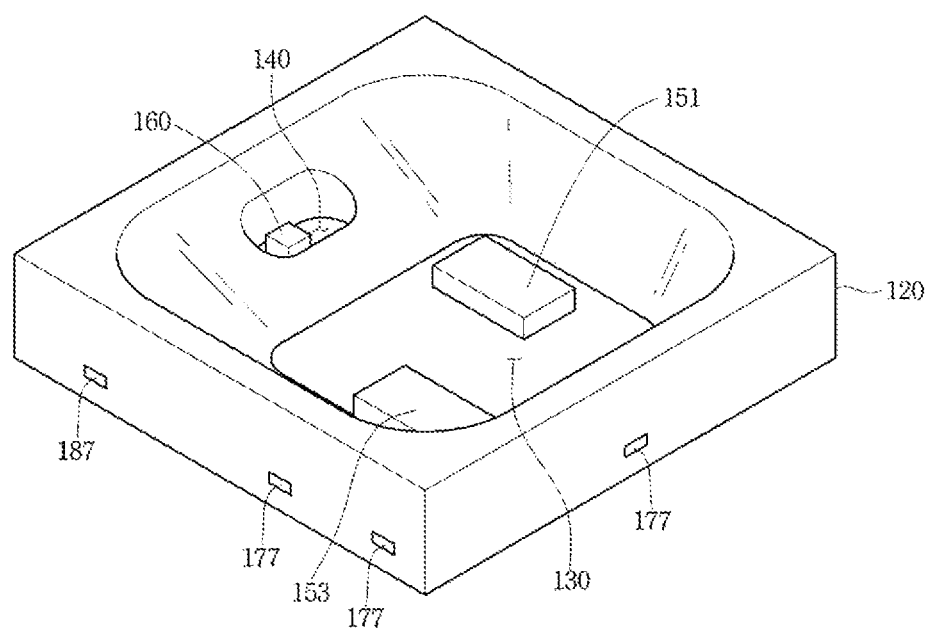
FIG. 1 is a perspective view illustrating a light emitting device package according to a first embodiment.
Figure 2:
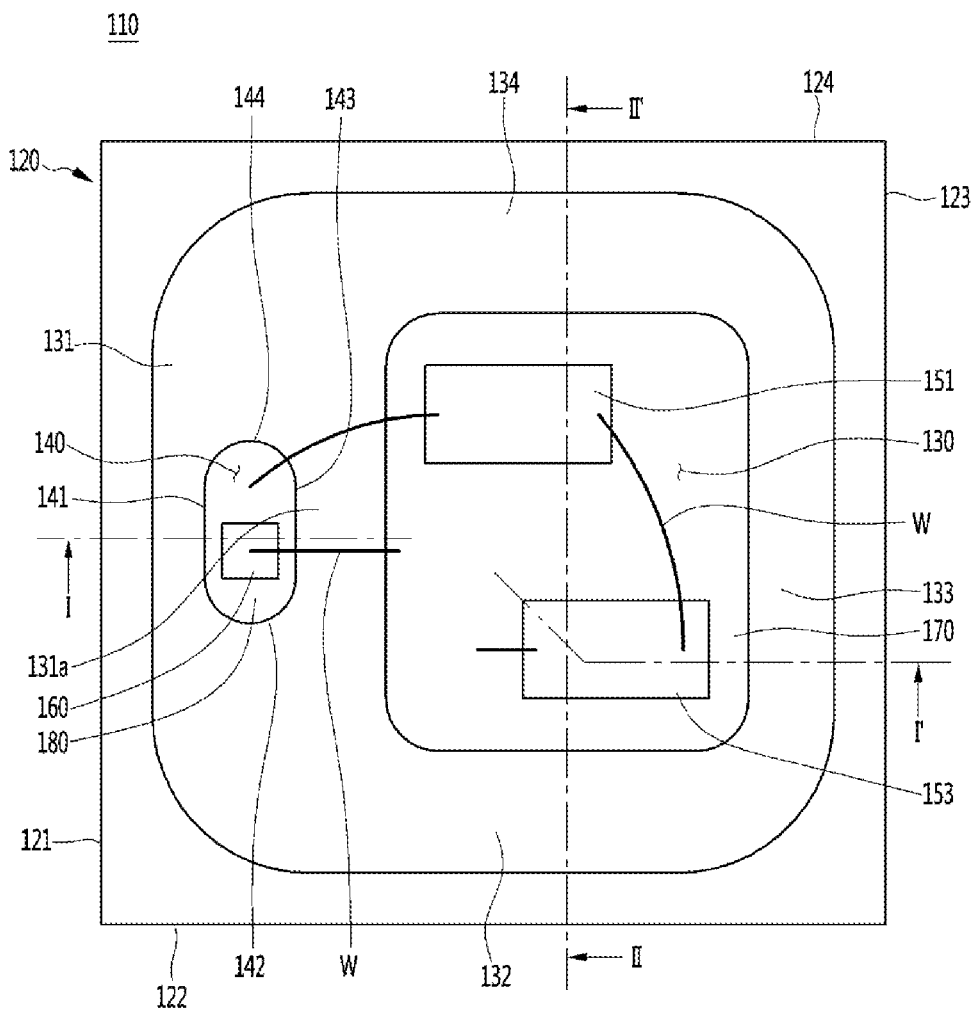
FIG. 2 is a plan view illustrating the light emitting device package according to the first embodiment.

FIG. 1 is a perspective view illustrating a light emitting device package according to a first embodiment and FIG. 2 is a plan view illustrating the light emitting device package according to the first embodiment.

Figure 3:
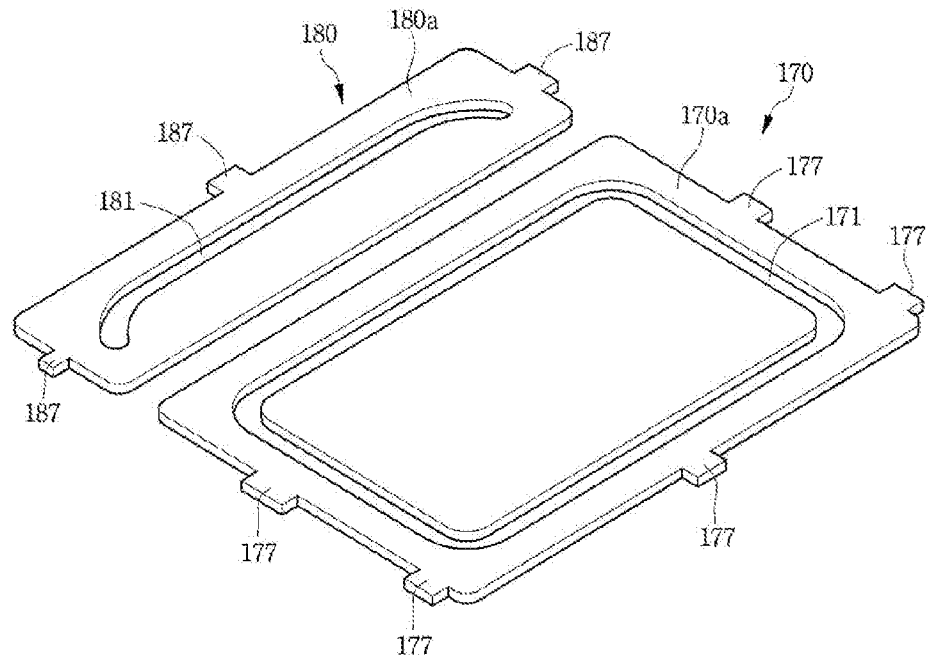
FIG. 3 is a perspective view illustrating upper portions of a first lead frame and a second lead frame according to the first embodiment.
Figure 4:
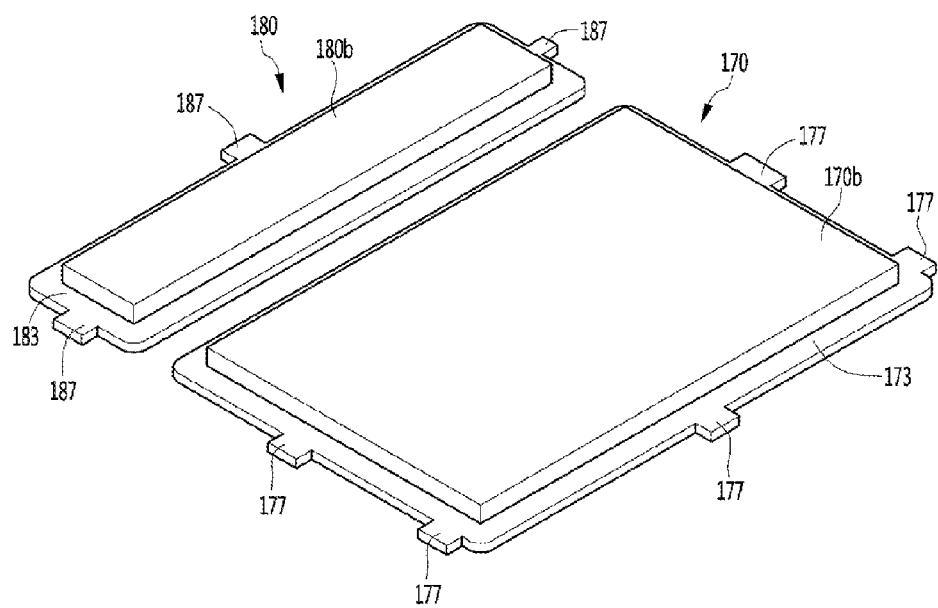
FIG. 4 is a perspective view illustrating lower portions of the first lead frame and the second lead frame according to the first embodiment.
Figure 5:
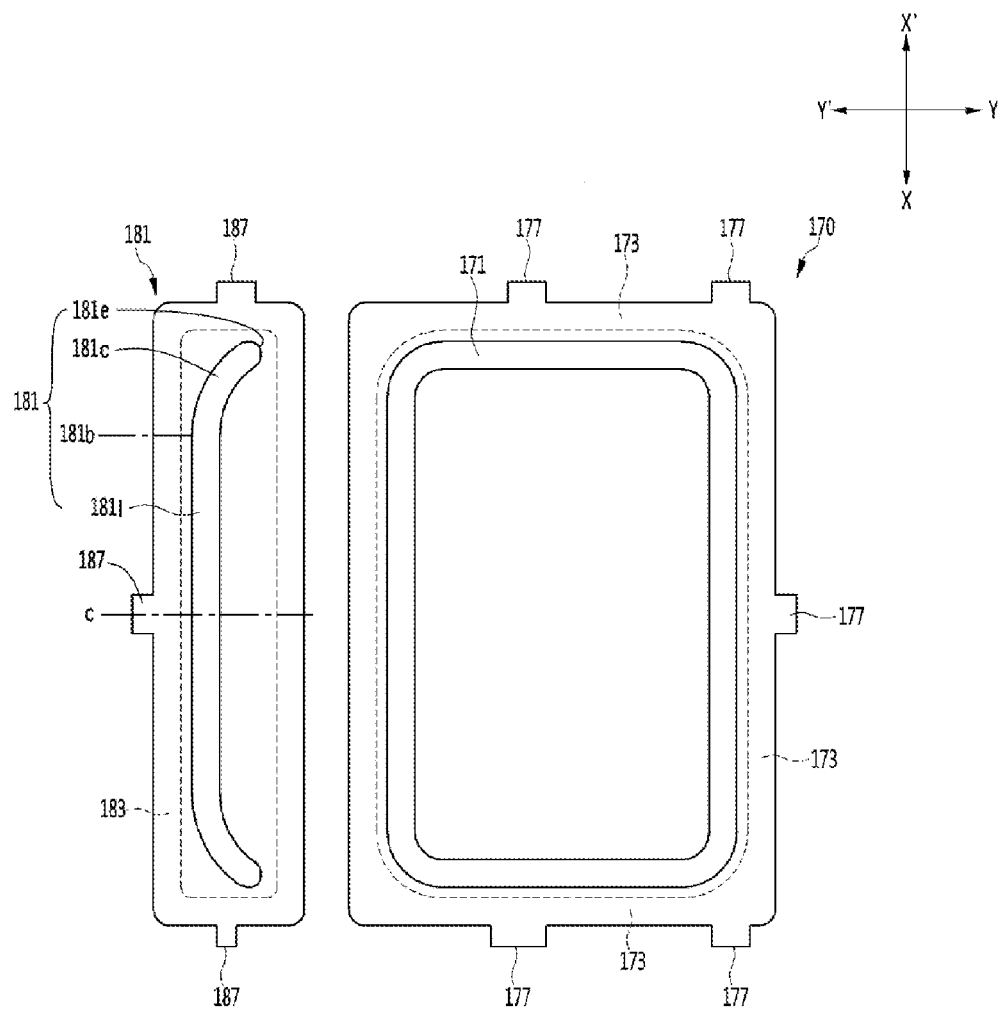
FIG. 5 is a plan view illustrating the first lead frame and the second lead frame according to the first embodiment.

FIG. 3 is a perspective view illustrating upper portions of a first lead frame and a second lead frame according to the first embodiment, FIG. 4 is a perspective view illustrating lower portions of the first lead frame and the second lead frame according to the first embodiment, and FIG. 5 is a plan view illustrating the first lead frame and the second lead frame according to the first embodiment.

Figure 6:
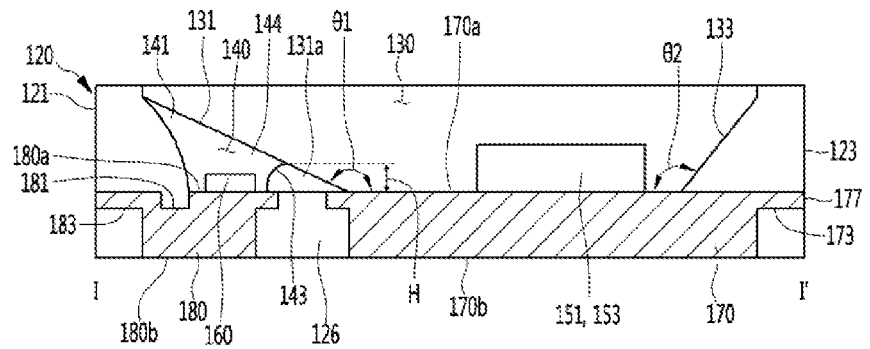
FIG. 6 is a cross-sectional view illustrating the light emitting device package taking along line I-I' in FIG. 2.
Figure 7:
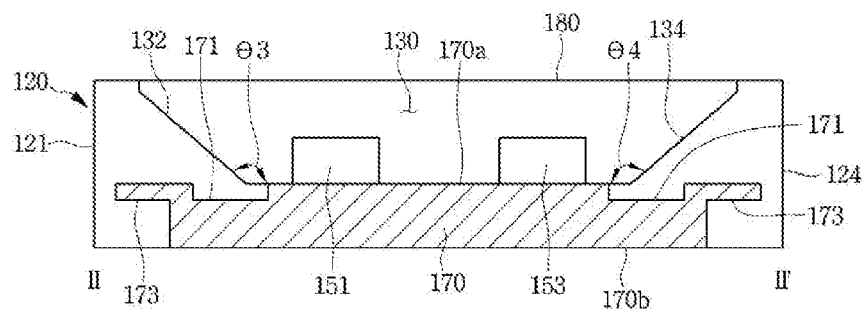
FIG. 7 is a cross-sectional view illustrating the light emitting device package taking along line II-II' in FIG. 2.

FIG. 6 is a cross-sectional view illustrating the light emitting device package taking along line I-I' in FIG. 2, and FIG. 7 is a cross-sectional view illustrating the light emitting device package taking along line II-II' in FIG. 2.

As illustrated in FIG. 1 to FIG. 7, a light emitting device package 110 according to the first embodiment may include a first lead frame 170, a second lead frame 180, a body 120, a protection device 160, and a first light emitting device 151 and a second light emitting device 153.

The first lead frame 170 and the second lead frame 180 may be coupled to the body 120 in a state of being spaced apart from each other by a fixed distance. The first light emitting device 151 and the second light emitting device 153 may be mounted on the first lead frame 170 and the protection device 160 may be mounted on the second lead frame 180. A width of the first lead frame 170 may be greater than a width of the second lead frame 180. However, it is not limited to this. The first lead frame 170 and the second lead frame 180 may include conductive material. For example, the first lead frame 170 and the second lead frame 180 may include at least one of titanium (Ti), copper (Cu), nickel (Ni), gold (Au), chrome (Cr), tantalum (Ta), platinum (Pt), tin (Sn), silver (Ag), phosphorus (P), iron (Fe), zinc (Zn), and aluminum (Al) and may be formed in a single layer or multiple layers.

The first lead frame 170 may include an upper portion surface 170a on which the first light emitting device 151 and the second light emitting device 153 are mounted and a lower portion surface 170b which is exposed from a lower portion of the body 120. The upper portion surface 170a and the lower portion 170b of the first lead frame 170 may be flat surfaces. The first lead frame 170 may include a first recess portion 171 which is disposed on the upper portion surface 170a of the first lead frame 170 and a first stepped portion 173 which is disposed on the lower portion surface 170b of the first lead frame 170. The first recess portion 171 may have a shape which is concave from the upper portion surface 170a of the first lead frame 170 in the direction of the lower portion surface 170b. The first recess portion 171 may be adjacent to an edge of the upper portion surface 170a. The first recess portion 171 may have a ring shape or a rectangular strip shape. However, it is not limited to this. The first recess portion 171 may have a round shape of which edges are bent. However, it is not limited to this. The first recess portion 171 may be improved a coupling force with the body 120 by increasing a contacting area with the body 120. Further, the first recess portion 171 may prevent external moisture penetration by a concave structure. The first recess portion 171 may be formed by being etched a portion of the upper portion surface 170a of the first lead frame 170. However, it is not limited to this. A depth of the first lead frame 171 may be 50% of a thickness of the first lead frame 170. However, it is not limited to this. For example, the depth of the first lead frame 171 may be equal to or less than 50% of the thickness of the first lead frame 170. The first recess portion 171 may be spaced apart from the first stepped portion 173 by a fixed distance. In other words, the first recess portion 171 may do not include a region which is vertically overlapped with the first stepped portion 173.

The first recess portion 171 may be disposed on the outside of the first cavity 130 which exposes a portion of the upper portion of the first lead frame 170 from the body 120. The first recess portion 171 may be disposed on the inside of the first stepped portion 173. Specifically, the first recess portion 171 may be disposed in the area which is between 5% and 30% of a minor axis width of the first lead frame 170 from the outside surface of the first lead frame 170. Here, a major axis of the first lead frame 170 is X-X' and the minor axis of the first lead frame 170 is Y-Y'.

In a case where the first recess portion 171 is disposed on an area which is less than 55 of the minor axis width of the first lead frame 170 from the outside surface of the first lead frame 170, the first recess portion 171 reduces a coupling force with the body 120 by reducing the width and the area of the first stepped portion 173 and thus may be difficult to prevent external moisture penetration. In a case where the first recess portion 171 is disposed on an area which is greater than 30% of the minor axis width of the first lead frame 170 from the outside surface of the first lead frame 170, the first recess portion 171 reduces a coupling force with the body 120 by a portion thereof being exposed to the first cavity 130 and thus may be difficult to prevent the external moisture penetration. For example, in a case where the minor width of the first lead frame 170 is 1,920 mm, the first recess portion 171 may be disposed in the region spaced apart from an adjacent outside surface of the first lead frame 170.

The first recess portion 171 may include a fixed width. For example, the first recess frame 171 may include 3% to 15% of width of the minor axis width of the first lead frame 170. In a case where the width of the first recess portion 171 is equal to or less than 3% of the minor axis width of the first lead frame 170, the first recess portion 171 reduces a coupling force with the body 120 by reducing a contacting area with the body 120 and thus may be difficult to prevent the external moisture penetration. In a case where the width of the first recess portion 171 is greater than 15% of the minor axis width of the first lead frame 170, rigidity of the first lead frame 170 may be reduced. For example, in a case where the minor width of the first lead frame 170 is 1,920 mm, the width of the first recess portion 171 may be between 50 μm and 290 μm.

The first stepped portion 173 may be disposed on the edge of the lower portion surface 170b of the first lead frame 170. The first stepped portion 173 may be connected along the edge of the lower portion surface 170b of the first lead frame 170. The first stepped portion 173 may has a recess shape and a cross-sectional surface thereof may have a stepped structure. However, it is not limited to this. The first stepped portion 173 may be improved a coupling force with the body 120 by increasing a contacting area with the body 120. Further, the first stepped portion 173 may prevent the external moisture penetration by a stepped structure. The first stepped portion 173 may be formed by being etched a portion of an edge of the lower portion surface 170b of the first lead frame 170. However, it is not limited to this. A thickness of the first stepped frame 173 may be 50% of the thickness of the first lead frame 170. However, it is not limited to this. For example, the thickness of the first stepped frame 173 may be equal to or greater than 50% of the thickness of the first lead frame 170. The first stepped portion 173 may be further disposed on the outside than the first recess portion 171.

The first lead frame 170 may include first projecting portions 177 projected in the outside direction. The first recess portions 177 may be spaced apart from the first stepped portion 173 in the outside direction. In other words, the thickness of the first projections 177 may be thinner than the thickness of the first lead frame 170. The horizontal width of each of the first projecting portions 177 may be different from each other. However, it is not limited to this. The ends of the first projecting portions 177 may be exposed from the outside surface of the body 120 to the outside. Even if not illustrated in drawings, units of the first lead frame 170 and the second lead frame 180 are made by processing a metal frame (not illustrated) with a press and then may be separated from a state where a plurality of the first lead frames 170 and a plurality of the second lead frames 180 are connected with each other after the injection process of the body 120. In other words, the plurality of the first lead frames 170 and the plurality of the second lead frames 180 may be include a hanger (not illustrated) for connecting the plurality of the first lead frames 170 and the plurality of the second lead frames 180 with each other since the injection process for coupling the bodies 120 connected with each other proceeds. The first projecting portions 177 may be a portion of the hanger connected to the first lead frame 170 in a separating process into units of the first lead frame 170 and the second lead frame 180.

The first lead frame 180 may include an upper portion surface 180a on which the protection device 160 is mounted and a lower portion surface 180b which is exposed from a lower portion of the body 120. The upper portion surface 180a and the lower portion 180b of the second lead frame 180 may be flat surfaces. The second lead frame 180 may include a second recess portion 181 which is disposed on the upper portion surface 180a of the second lead frame 180 and a second stepped portion 183 which is disposed on the lower portion surface 180b of the second lead frame 180. The second recess portion 181 may have a shape which is concave from the upper portion surface 180a of the second lead frame 180 in the direction of the lower portion surface 180b. The second recess portion 181 may be adjacent to the edge of the upper portion surface 180a of the second lead frame 180. The second recess portion 181 may be disposed to be parallel in the longitudinal direction of the second lead frame 180. The second recess portion 181 may have both ends which have a bent shape. However, it is not limited to this. The second recess portion 181 may include have both ends which have a bent shape to face each other. However, it is not limited to this. The second recess portion 181 may be improved a coupling force with the body 120 by increasing a contacting area with the body 120. Further, the second recess portion 181 may prevent the external moisture penetration by a concave structure. The second recess portion 181 may be formed by etching a portion of the upper portion surface 180a of the second lead frame 180. However, it is not limited to this. A depth of the second lead frame 181 may be 50% of a thickness of the second lead frame 180. However, it is not limited to this. For example, the depth of the second lead frame 181 may be equal to or less than 50% of a thickness of the second lead frame 180. The second recess portion 181 may be spaced apart from the second stepped portion 183 by a fixed distance. In other words, the second recess portion 181 may not include a region which is vertically overlapped with the second stepped portion 183.

The second recess portion 181 may be disposed on the outside of the second cavity 140 which exposes the portion of the upper portion of the second lead frame 180 from the body 120. The second recess portion 181 may be disposed on the inside of the second stepped portion 183. Specifically, the both ends 180e of the second recess portion 181 may be disposed in the area which is between 15% and 85% of a minor axis width of the second lead frame 180 from the outside surface of the second lead frame 180 which is furthest from the first lead frame 170. Here, a major axis of the second lead frame 180 is X-X' and the minor axis of the second lead frame 180 is Y-Y'.

In a case where the second recess portion 181 is disposed on an area which is less than 15% of the minor axis width of the second lead frame 180 from the outside surface of the second lead frame 180, the second recess portion 171 reduces a coupling force with the body 120 by reducing the width and the area of the second stepped portion 183 and thus may be difficult to prevent the external moisture penetration. In a case where the second recess portion 181 is disposed on an area which is greater than 85% of the minor axis width of the second lead frame 180 from the outside surface of the second lead frame 180, a portion of the second recess portion 181 is exposed to the second cavity 140 or the second recess portion 171 is reduced a coupling force with the body 120 by reducing the width and the area of the second stepped portion 183 and thus may be difficult to prevent the external moisture penetration. For example, in a case where the minor width of the first lead frame 180 is 0.680 mm, both ends 180e of the second recess portion 181 may be disposed in the region spaced apart by 180 μm to 580 μm from the outside surface of the second lead frame 180 which is furthest from the first lead frame 170.

The second recess portion 181 may include a fixed width. For example, the second recess portion 181 may include 7% to 43% of width of the minor axis width of the second lead frame 180 from the body 120. In a case where the width of the second recess portion 181 is less than 7% of the minor axis width of the second lead frame 180, the second recess portion 181 reduces a coupling force with the body 120 by reducing a contacting area with the body 120 and thus may be difficult to prevent external moisture penetration. In a case where the width of the second lead frame 181 is greater than 43% of the minor axis width of the second lead frame 180 and thus rigidity of the second lead frame 180 may be reduced. For example, in a case where the minor width of the second lead frame 180 is 0.680 mm, the width of the second recess portion 181 may be between 50 μm and 290 μm.

The second recess portion 181 may include a rectilinear portion 181*l*, a bent portion 181*c* and both ends 181*e* along the major axis of the second recess portion 181 about a center portion C of the second recess portion 181. The bent portion 181*c* may be bent in a second direction Y of the minor axis of the second lead frame 180. The bent portion 181*c* may be spaced apart from the rectilinear portion 181*l* by a fixed distance. The bent portion 181*c* may be disposed between 20% and 80% of a major axis length or width of the major axis of the second recess portion 181 from the center portion C of the second recess portion 181 in the major axis (X-X') direction of the second lead frame 180. For example, a boundary region 181*b* between the bent portion 181*c* and the rectilinear portion 181*l* may be disposed between 20% and 80% of the second recess portion 181 from the center portion C of the second recess portion 181 in the major axis (X-X') direction of the second lead frame 180.

The second stepped portion 183 may be disposed on the edge of the lower portion surface 180*b* of the second lead frame 180. The second stepped portion 183 may be connected along the edge of the lower portion surface of the second lead frame 180. The second stepped portion 183 may has a recess shape and a cross-sectional surface thereof may have a stepped structure. However, it is not limited to this. The second stepped portion 183 may be improved a coupling force with the body 120 by increasing a contacting area with the body 120. Further, the second stepped portion 183 may prevent the external moisture penetration by a stepped structure. The second stepped portion 183 may be formed by being etched a portion of an edge of the lower portion surface 180*b* of the second lead frame 180. However, it is not limited to this. A thickness of the second stepped frame 183 may be 50% of the thickness of the second lead frame 180. However, it is not limited to this. For example, the thickness of the second stepped portion 183 may be equal to or greater than 50% of the thickness of the second lead frame 180. The second stepped portion 183 may be further disposed on the outer than the second stepped portion 181.

The second lead frame 180 may include second projecting portions 187 projected in the outside direction. The second recess portions 187 may be projected from the third stepped portion 183 in the outside direction. In other words, the thickness of the second projections 187 may be thinner than the thickness of the second lead frame 180. The horizontal width of each of the second projecting portions 187 may be different from each other. However, it is not limited to this. The ends of the second projecting portions 187 may be exposed from the outside surface of the body 120 to the outside. The second projecting portions 187 may be a portion of the hanger connected to the second lead frame 180 in a separating process into units of the first lead frame 180 and the second lead frame 180.

The first light emitting device 151 and the second light emitting device 153 may be disposed on the first lead frame 170. The first light emitting device 151 and the second light emitting device 153 may be disposed on the upper portion surface of the first lead frame 170 which is exposed from the body 120. Even if the first light emitting device 151 and the second light emitting device 153 according to the embodiment is described as two configurations connected to each other in series, it is not limited to this. In other words, they may be a single configuration, may be configured to be in an array form, or may be at least three configurations. The first light emitting device 151 and the second light emitting device 153 may be connected through a wire W. However, it is not limited to this. The first light emitting device 151 and the second light emitting device 153 is spaces apart from each other and the first light emitting device 151 and the second light emitting device 153 may be symmetrically disposed in a diagonal direction of the first lead frame 170 on the upper portion surface of the first lead frame 170 exposed from the body 120. However, it is not limited to this.

The protection device 160 may be disposed on the second lead frame 180. The protection device 160 may be disposed on the upper portion surface of the second lead frame 180 which is exposed from the body 120. The protection device 160 may be a Zener diode, a thyristor, a transient voltage suppression (TVS), or the like. However, it is not limited to this. The protection device 160 according to the embodiment describes the Zener diode which protects the first light emitting device 151 and the second light emitting device 153 from electro static discharge (ESD) as an example. The protection device 160 may be connected to the first lead frame 170 through a wire W.

The body 120 may include at least one of translucent material, reflective material, and insulating material. The body 120 may include material of which reflectivity is higher than permeability, for light emitted from the first light emitting device 151 and the second light emitting device 153. The body 120 may be resin based insulating material. The body 120 may be made of at least one of polyphthalamide (PPA), resin material such as epoxy or silicone material, silicon (Si), metallic material, photo sensitive glass (PSG), sapphire (Al2O3), a printed circuit board (PCB), for example. The body 120 may include an outside surface having a fixed curvature or an outside surface having an angled surface. A plan view shape of the body may be a circular shape or a polygonal shape, for example. The body 120 according to the embodiment is described a polygonal shape which include a first outside surface 121 to a fourth outside surface 124, as an example.

The body 120 may be coupled with the first lead frame 170 and the second lead frame 180. The body 120 may include a first cavity 130 which exposes a portion of the upper portion of the first lead frame 170.

The body 120 may include a spacer 126 which is disposed between the first lead frame 170 and the second lead frame 180. The spacer 126 may be disposed on the bottom surface of the first cavity 130. The spacer 126 may be disposed to be parallel to the first stepped portion 173 and the second stepped portion 183 which face each other. The spacer 126 may be directly in contact with the first stepped portion 173 and the second stepped portion 183. The spacer 126 may be made of insulating material and may be a portion of the body 120. However, it is not limited to this. The spacer 126 includes a stepped structure which corresponds to the stepped structure of the first stepped portion 173 and the second stepped portion 183. In other words, the cross-section of the spacer 126 may have a step structure which is symmetric in the horizontal direction. The spacer 126 may be improved a coupling force since the contacting area with the first lead frame 170 and the second lead frame 180 increases by the stepped structure which is in contact with the first stepped portion 173 and the second stepped portion 183. Therefore, the embodiment is capable of preventing the external moisture penetration.

The first cavity 130 may include a bottom surface which exposes the first lead frame 170 and a first inside surface 131 to the fourth inside surface 134 which positions along the edge of the exposed first lead frame 170. The first inside surface 131 may be disposed to face the third inside surface 133. The second inside portion 132 may be disposed to face the fourth inside surface 134. The first inside surface 131 to the fourth inside surface 134 may be disposed to be inclined from the bottom surface of the body 120.

An area of the first lead frame 170 exposed to the bottom surface of the first cavity 130 may be less than 40% of an area surrounded by the first outside surface 121 to the fourth outside surface 124 of the body 120. For example, the area of the first lead frame 170 exposed to the bottom surface of the first cavity 130 may be between 20% and 40% of an area surrounded by the first outside surface 121 to the fourth outside surface 124 of the body 120. Specifically, the area of the first lead frame 170 exposed to the bottom surface of the first cavity 130 may be between 12% and 26% of the area surrounded by the first outside surface 121 to the fourth outside surface 124 of the body 120. For example, in a case where the area surrounded by the first outside surface 121 to the fourth outside surface 124 of the body 120 may be 3.0 mm×3.0 mm, the area of the first lead frame 170 exposed to the bottom surface of the first cavity 130 may be between 1.390 mm×0.840 mm and 1.390 mm×1.680 mm.

The embodiment is capable of improving loss of light which is absorbed into the first lead frame 170, improving the light extraction efficiency, and increasing the luminous flux, by the area of the first lead frame 170 exposed to the bottom surface of the first cavity 130 having a range between 20% and 40% of the entire area of the body 120. In a case where the area of the first cavity 130 is less than 20%, a problem on the mounting process of the first light emitting device 151 and the second light emitting device 153 may be generated due to constraint of space for mounting of the first light emitting device 151 and the second emitting device 153. In a case where the area of the first cavity 130 is greater than 40%, the reflectivity may be reduced since the area of the first inside surface 131 to the fourth inside surface 134 are reduced and light extraction may be reduced due to the light loss since the exposed area of the first lead frame 170 increases and thus the light of the first light emitting device 151 and the second light emitting device 153 is absorbed into the first lead frame 170.

In the embodiment, the first inside surface 131 and the third inside surface 133 of the first cavity 130 facing each other may have an inclined angle to the upper surface of the first lead frame 170 which are different from each other. The inclined angle θ1 of the first inside surface 131 may be greater than the inclined angle θ2 of the third inside surface 133. However, it is not limited to this.

The embodiment may determine the inclined angle θ1 of the first inside surface 131 and the inclined angle θ2 of the third inside surface 133 which face each other according to the area of the first lead frame exposed to the bottom surface of the first cavity 130. For example, in a case where the area of the first lead frame 170 exposed to the bottom surface of the first cavity 130 increases between 20% and 30% of the entire area of the body 120, the inclined angle θ1 of the first inside surface 131 may be decreased from 160 degrees to 156 degrees and the inclined angle θ2 of the third inside surface 133 may be decreased from 140 degrees to 119 degrees.

The second inside surface 132 and the fourth inside surface 134 may have the inclined angles to the upper surface of the first lead frame 170 which are the same to each other. An inclined angle θ3 of the second inside surface 132 may be the same as an inclined angle θ4 of the fourth inside surface 134. However, it is not limited to this.

The body 120 may include a second cavity 140 which expose a portion of an upper surface of the second lead frame 180. The second cavity 140 may position on a first inside surface 131 of the first cavity 130. The second cavity 140 is capable of exposing a portion of an upper surface of the second lead frame 180 through the first inside surface 131. For example, a plan view shape of the first cavity 140 may be a circular, an oval, a polygonal shape. An area of the second lead frame 180 exposed to the bottom surface of the second cavity 140 may be less than 20% of an area surrounded by the first outside surface 121 to the fourth outside surface 124 of the body 120. For example, the area of the second lead frame 180 exposed to the bottom surface of the second cavity 140 may be between 3% and 20% of an area surrounded by the first outside surface 121 to the fourth outside surface 124 of the body 120. The embodiment is capable of improving loss of light which is absorbed into the second lead frame 180, improving the light extraction efficiency, and increasing luminous flux, by the area of the second lead frame 180 exposed to the bottom surface of the second cavity 140 having a range between 3% and 20% of the area surrounded by the first outside surface 121 to the fourth outside surface 124 of the body 120. In a case where the area of the second cavity 140 is less than 3%, a problem on the mounting process of the protection device 160 may be generated due to constraint of space for mounting of the protection device 160. In a case where area of the second cavity 140 is greater than 20%, the light extraction may be decreased by a reduction of reflectivity and light loss. For example, in a case where the area surrounded by the first outside surface 121 to the fourth outside surface 124 of the body 120 may be 3.0 mm×3.0 mm, the area of the second lead frame 180 exposed to the bottom surface of the second cavity 140 may be between 0.350 mm×0.140 mm and 2 to 1.390 mm×1.680 mm.

The second cavity 140 may include a bottom surface which exposes the second lead frame 180 and a fifth inside surface 141 to the eighth inside surface 144 which positions along the edge of the exposed second lead frame 180. The fifth inside surface 141 may be disposed to face the seventh inside surface 143. The fifth inside surface 141 may have a height which is greater than the height of the seventh inside surface 143. The sixth inside surface 142 may be disposed to face the eighth inside surface 144.

The fifth inside surface 141 may have a fixed curvature R so that the light emitted from the first light emitting device 151 and the second light emitting device 153 on the first inside surface 131 is reflected in the various directions. For example, the curvature R of the fifth inside surface 141 may be in a range between 0.1 mm to 0.3 mm. The curvature R of the fifth inside surface 141 is capable of improving the light extraction efficiency by improving total reflection of light emitted from the first light emitting device 151 and the second light emitting device 153. In a case where the curvature R of the fifth inside surface 141 is less than 0.1 mm, the light emitted from the first light emitting device 151 and the second light emitting device 153 generates the light loss since being totally reflected by a critical angle. In a case where the curvature R of the fifth inside surface 141 is greater than 0.3 mm, a problem on the process may be generated due to restrictions about the thickness and the height of the body 120.

The sixth inside surface 142 to the eighth inside surface 144 may have a fixed curvature. However, it is not limited to this. For example, the sixth inside surface 142 to the eighth inside surface 144 may have a curvature only in a boundary region with the first inside surface 131 and also may have a curvature corresponding to the curvature of the fifth inside surface 141. Further, the curvatures of the sixth inside surface 141 and the eighth inside surface 144 may differ from each other.

A boundary portion 131a may be disposed between the second cavity 140 and the first lead frame 170 exposed from the first cavity 130. The boundary portion 131a may be disposed in the first inside surface 131. The boundary portion 131a may be connected with the seventh inside surface 143 of the second cavity 140. The boundary portion 131a may be disposed on the spacer 126. The boundary portion 131a may be vertically overlapped with the spacer 126.

The boundary portion 131a may have a height H so that an inside thereof facing the protection device 160 is higher than the protection device 160. The problem that light emitted from the first light emitting device 151 and the second light emitting device 153 is lost by directly being provided to the protection device 160 is capable of improving since the inside of the boundary portion 131a which is facing the protection device 160 has a height H which is higher than the height of the protection device 160. For example, the height H of the boundary portion 131a may be between 100 μm and 300 μm and the height of the protection device 160 may be less than 100 μm. However, it is not limited to this. In a case where the height H of the boundary portion 131a is greater than 300 μm, a connection process of a wire W which connects between the protection device 160 and the first lead frame 170 may be difficult.

The light emitting device package 110 according to the first embodiment include the first cavity 130 which exposes the upper portion surface of the first lead frame 170 on which the first light emitting device 151 and the second light emitting device 153 are mounted and the second cavity 140 which exposes the upper portion surface of the second lead frame 180 on which the protection device 160 are mounted. The area of the first lead frame 170 exposed to the bottom surface of the first cavity 130 has a range between 20% and 40% of the entire area of the body 120 and thus loss of light absorbed into the first lead frame 170 may be prevented. Further, in the light emitting device package 110 of the embodiment, the area of the second lead frame 180 exposed to the bottom surface of the second cavity 14 has a range between 3% and 10% of the entire area of the body 120 and thus the light loss due to the second cavity 140 is minimized.

In the light emitting device package 110 according to the first embodiment, the curvature R of the fifth inside surface 141 of the second cavity 140 has a range between 0.1 mm and 0.3 mm. Therefore, the light extraction efficiency may be improved by improving the total reflection of right emitted from the first light emitting device 151 and the second light emitting device 153.

Figure 8:
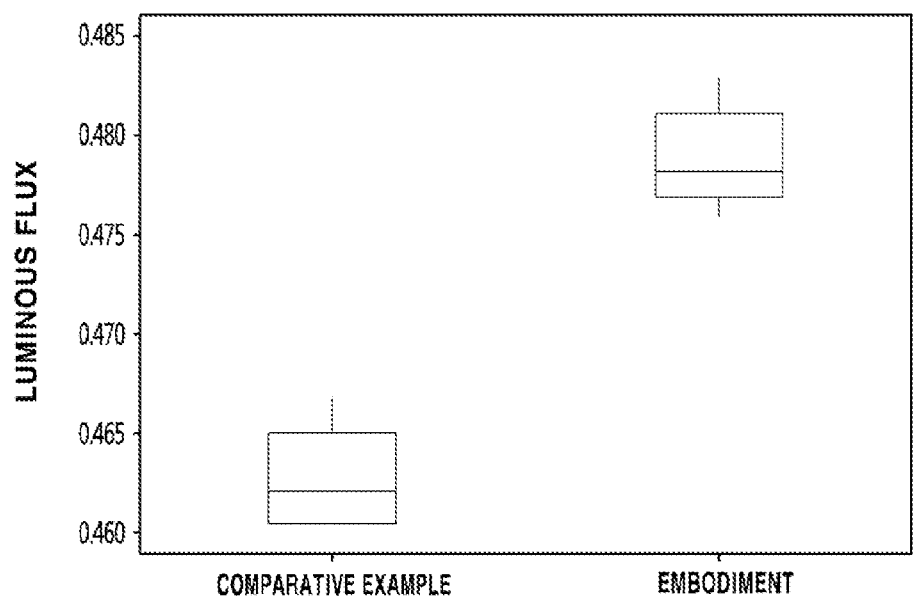
FIG. 8 is a graph comparing a luminous flux in a comparative example to a luminous flux in the first embodiment.

FIG. 8 is a graph comparing a luminous flux in a comparative example to a luminous flux in the first embodiment.

As illustrated in FIG. 8, in the first embodiment, the luminous flux may be improved by at least 3.6% compared to the comparative example.

The comparative example includes a body which has a cavity and a first lead frame and a second lead frame which are exposed to the bottom surface of the cavity and may be a structure in which an exposed area of the first lead frame and the second lead frame is greater than 50% of the entire area of the body.

The embodiment is a light emitting device package adapting technical characteristics of FIG. 1 to FIG. 7.

Figure 9:
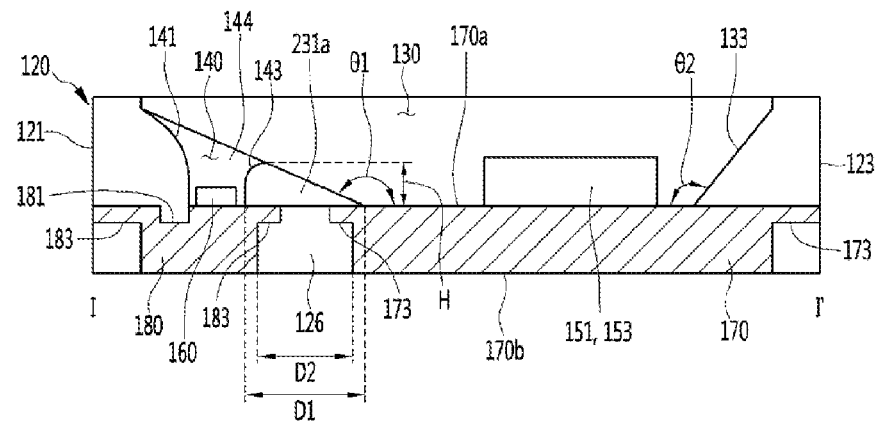
FIG. 9 is a cross-sectional view illustrating the light emitting device package according to a second embodiment.

FIG. 9 is a cross-sectional view illustrating a light emitting device package according to a second embodiment.

As illustrated in FIG. 9, the light emitting device package according to the second embodiment may adapt technical characteristics of the light emitting device package according to the first embodiment of the FIG. 1 to FIG. 7, except for a boundary portion 231a.

The boundary portion 231a may be disposed in a first inside surface 131. The boundary portion 231a is disposed on the spacer 126 and may disposed on a portion of the upper portion surface 170a of the first lead frame 170 which is in contact with the spacer 126 and a portion of the upper portion surface 180a of the second lead frame 180. The boundary portion 231a may have a height H which is higher than the protection device 160. The problem that light emitted from the first light emitting device 151 and the second light emitting device 153 is lost by directly being provided to the protection device 160 is capable of being improved since the boundary portion 231a has a height H which is higher than the height of the protection device 160.

One end of the boundary portion 231a in the minor axis direction may be disposed to be more adjacent to the first light emitting device 151 and the second light emitting device 153 than one end of the spacer 126 in the minor axis direction. An opposite end of the boundary portion 231a in the minor axis direction may be disposed to be more adjacent to the protection device 160 than the opposite end of the spacer 126 in the minor axis direction.

A width D1 of the boundary portion 231a in the minor axis direction may be greater than the width D2 of the spacer 126 in the minor axis direction. A width D1 of the boundary portion 231a in the minor axis direction may be equal to or greater than the width D2 the lower surface of the spacer 126 in the minor axis direction. The boundary portion 231a may be made of insulating material and may be a portion of the body 120. However, it is not limited to this. For example, the boundary portion 231a may be made of the same material with the material of the spacer 126.

The light emitting device package according to the second embodiment may improve a coupling force with the body 129 and prevent the external moisture penetration, by widening a contacting area with the body 120 by the structure of the boundary portion 231a covering the spacer 126.

Figure 10:
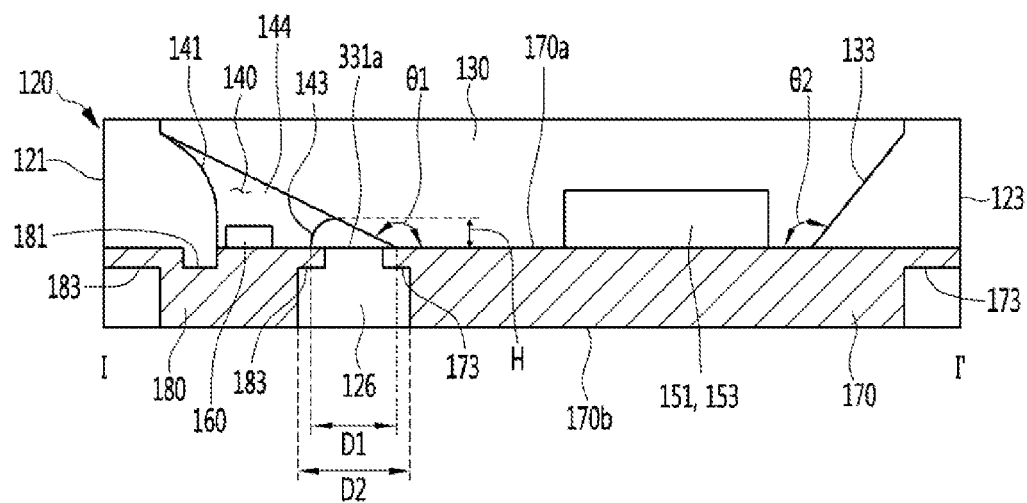
FIG. 10 is a cross-sectional view illustrating the light emitting device package according to a third embodiment.

FIG. 10 is a cross-sectional view illustrating the light emitting device package according to a third embodiment.

As illustrated in FIG. 10, the light emitting device package according to the third embodiment may adapt the technical characteristics of the light emitting device package according to the first embodiment according to the FIG. 1 to FIG. 7, except for a boundary portion 331a.

The boundary portion 331a may be disposed in a first inside surface 131. The boundary portion 331a is disposed on the spacer 126 and may disposed on a portion of the upper portion surface 170a of the first lead frame 170 which is in contact with the spacer 126 and a portion of the upper portion surface 180a of the second lead frame 180. The boundary portion 331a may have a height H which is higher than the protection device 160. The problem that light emitted from the first light emitting device 151 and the second light emitting device 153 is lost by directly being provided to the protection device 160 is capable of being improved since the boundary portion 331a has a height H which is higher than the height of the protection device 160.

The boundary portion 331a may cover the upper portion surface of the spacer 126. A width D1 of the boundary portion 331a in the minor axis direction may be equal to or less than the width D2 of the spacer 126 in the minor axis direction. A width D1 of the boundary portion 331a in the minor axis direction may be equal than or less than the width D2 of the lower surface of the spacer 126 in the minor axis direction. The boundary portion 331a may be made of insulating material and may be a portion of the body 120. However, it is not limited to this. For example, the boundary portion 331a may be made of the same material with the material of the spacer 126.

The light emitting device package according to the third embodiment may improve a coupling force with the body 129 and prevent the external moisture penetration, by widening a contacting area with the body 120 due to the structure of the boundary portion 331a covering the spacer 126.

Figure 11:
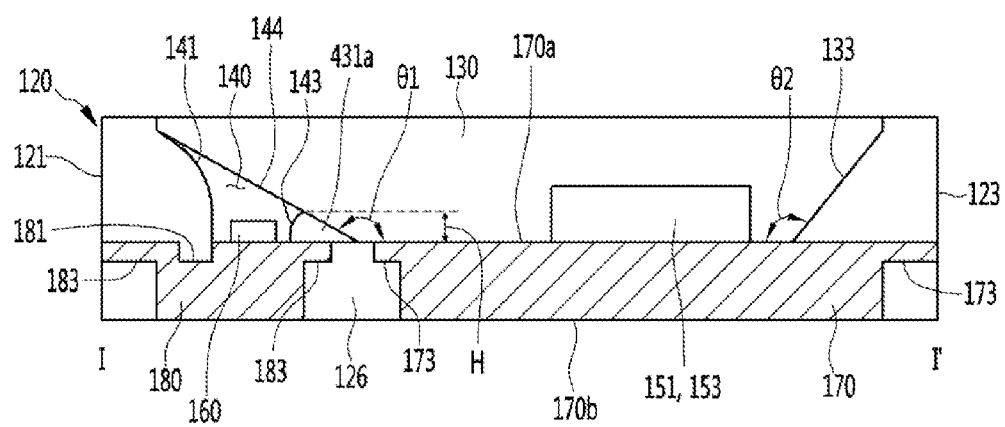
FIG. 11 is a cross-sectional view illustrating the light emitting device package according to a fourth embodiment.

FIG. 11 is a cross-sectional view illustrating the light emitting device package according to a fourth embodiment.

As illustrated in FIG. 11, the light emitting device package according to the fourth embodiment may adapt the technical characteristics of the light emitting device package according to the first embodiment of the FIG. 1 to FIG. 7, except for a boundary portion 431a.

The boundary portion 431a may be disposed in a first inside surface 131. The boundary portion 431a is disposed on the spacer 126 and may dispose on a portion of the upper portion surface 180a of the second lead frame 180 which is in contact with the spacer 126. Here, a portion of the upper portion surface of the spacer 126 may expose from the boundary portion 431a. The boundary portion 431a may be not contact with the upper portion surface 170a of the first lead frame 170. The boundary portion 431a may have a height H which is higher than the protection device 160. The problem that light emitted from the first light emitting device 151 and the second light emitting device 153 is lost by directly being provided to the protection device 160 is capable of being improved since the boundary portion 431a has a height H which is higher than the height of the protection device 160.

One end of the boundary portion 431a in the minor axis direction may be disposed on the upper surface of the spacer 126. One end of the boundary portion 431a in the minor axis direction may be disposed to be further away from the first light emitting device 151 and the second light emitting device 153 than the opposite one end of the spacer 126 in the minor axis direction by being disposed on the upper portion surface of the spacer 126. An opposite end of the boundary portion 431a in the minor axis direction may be disposed to be more adjacent to the protection device 160 than the opposite end of the spacer 126 in the minor axis direction.

The light emitting device package according to the fourth embodiment may improve a coupling force with the body 129 and prevent the external moisture penetration, by widening a contacting area with the body 120 by the structure of the boundary portion 431a covering a portion of the spacer 126.

Figure 12:
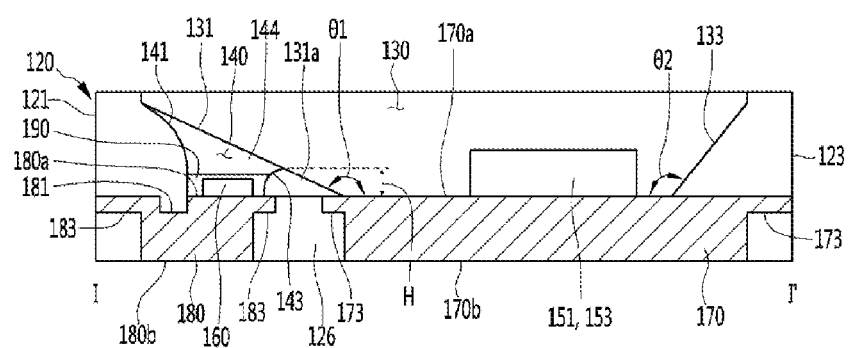
FIG. 12 is a plan view illustrating the light emitting device package according to the fifth embodiment.

FIG. 12 is a cross-sectional view illustrating the light emitting device package according to the fifth embodiment.

As illustrated in FIG. 12, the light emitting device package according to the fifth embodiment may adapt the technical characteristics of the light emitting device package according to the first embodiment of the FIG. 1 to FIG. 7, except for a reflection molding portion 190.

The reflection molding portion 190 may is disposed in the second cavity 140. The reflection molding portion 190 may cover the protection device 160. An upper portion surface of the reflection molding portion 190 may be a position which is lower than the upper portion surface of the boundary portion 131a. However, it is not limited to this. For example, the upper portion of the reflection molding portion 190 may be position on the same plane as the upper portion surface of the boundary portion 131a. A height of the reflection molding portion 190 may be higher than the height of the protection device 160. However, it is not limited to this. The height of the reflection molding portion 190 may be equal to or less than the height of the boundary portion 131a. However, it is not limited to this.

The reflection molding portion 190 may include insulating material or reflective material. The reflection molding portion 190 may be made of at least one of polyphthalamide (PPA), poly-cyclo-hecylene dimethyl terephthalate (PCT), white silicone, and white epoxy molding compound (white EMC). However, it is not limited to this.

In a light emitting device package according to the fifth embodiment, the reflection molding portion 190 covering the protection device 160 is disposed in the second cavity 140 and reflects light which is absorbed into the protection device 160 and thus light extraction efficiency is capable of further improving.

The light emitting device package has a structure in which the first light emitting device 151 and the second light emitting device 153 are disposed on the first cavity 130. However, it is not limited to this. In other words, the light emitting device package has a structure in which at least three light emitting devices are disposed on the first cavity 130.

FIG. 13 to FIG. 22 are plan views or cross-sectional views illustrating light emitting device packages having another embodiments of reflection molding portions 290a to 290e.

The light emitting device packages according to FIG. 13 to FIG. 22 may adapt the technical characteristics of the light emitting device package according to the first embodiment of the FIG. 1 to FIG. 7, except for the reflection molding portions 290a to 290e.

A light emitting device package according to another embodiment may improve the light extraction efficiency. To this end, the light emitting device packages according to another embodiment may include the reflection molding portion 290a to 290e. The reflection molding portions 290a to 290e are capable of covering the protection device 160, a first wire 160w, and a wire bonding portion 160a. However, it is not limited to this. For example, the reflection molding portions 290a to 290e may cover the protection device 160 and the wire bonding portion 160a and cover a portion of the first wire 160w. The reflection molding portions 290a to 290e may reflect the light absorbed by the protection device 160, the first wire 160w, and the wire bonding portion 160a and thus the light extraction efficiency may be improved.

Further, the reflection molding portions 290a to 290e may have reflectivity which is greater than the reflectivity of the first lead frame 170. The reflection molding portions 290a to 290e extend to the upper portion surface 170a of the first lead frame 170 exposed to the first cavity 130 and thus are capable of improving the light extraction efficiency.

Figure 13:
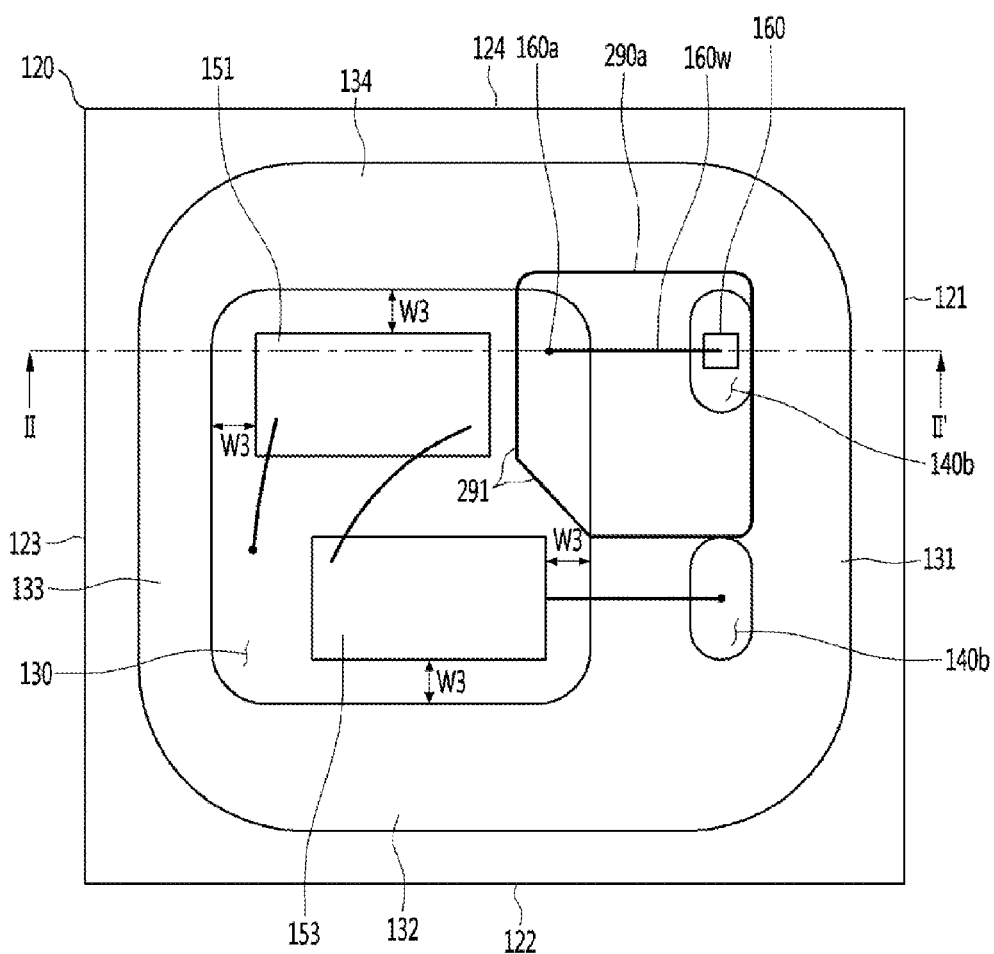
FIG. 13 to FIG. 22 are plan views or cross-sectional views illustrating light emitting device packages having another embodiment of a reflection molding portion.
Figure 14:
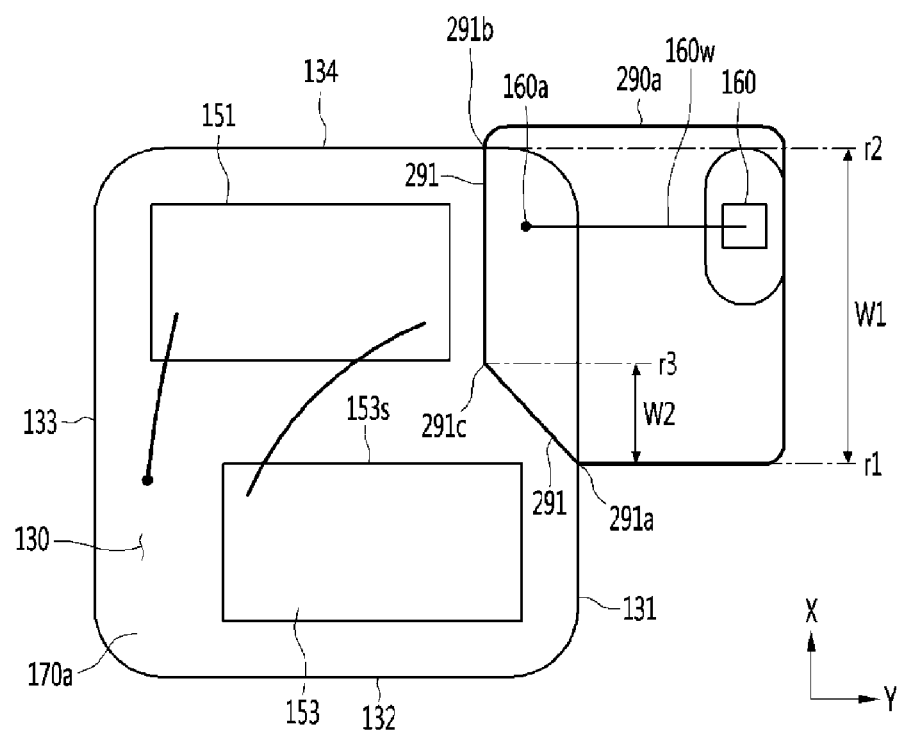
Figure 15:
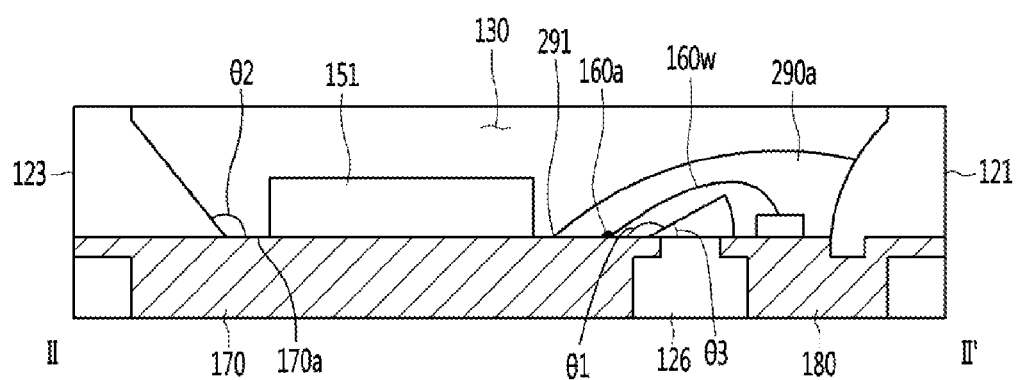
Figure 16:
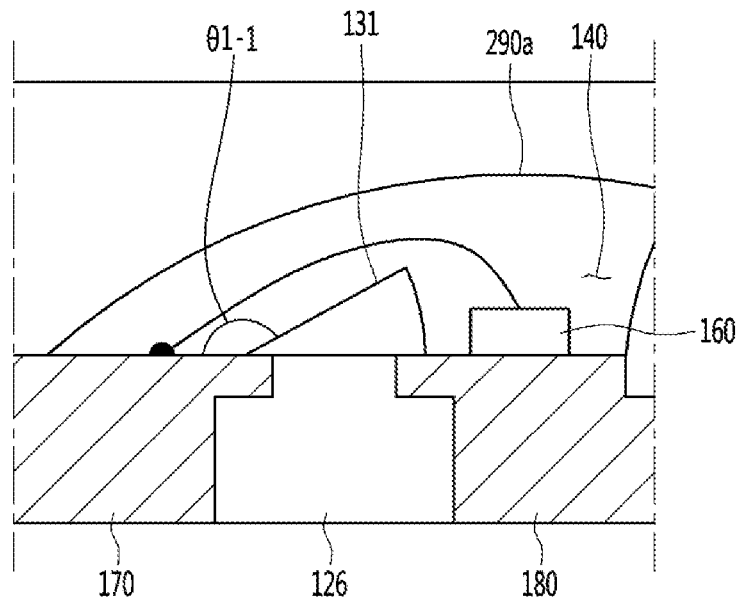
Figure 17:
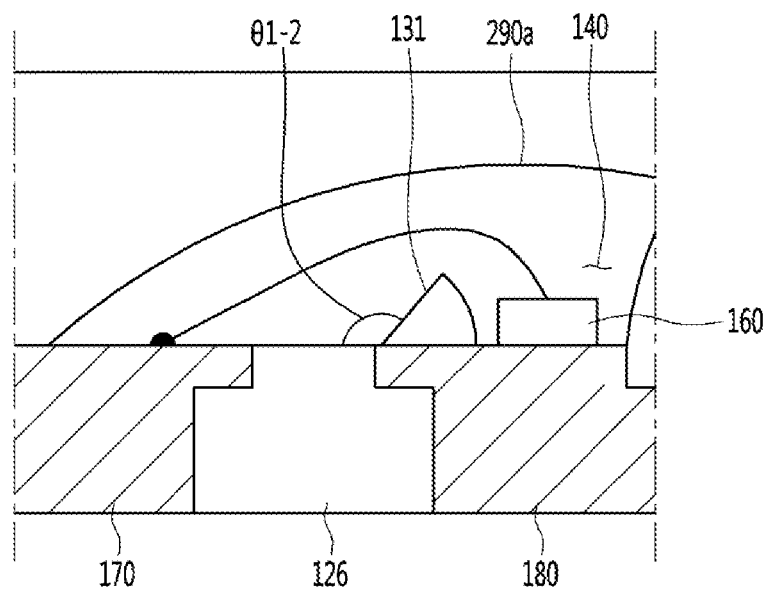

With reference to FIG. 13 to FIG. 15, the reflection molding portion 290a according to the second embodiment may be disposed on the second cavity 140. A portion of the reflection molding portion 290a may disposed on the upper portion surface 170a of the first lead frame 170 exposed from the first cavity 130. The reflection molding portion 290a may extend to the bottom surface of the first cavity 130 which is closest to the second cavity 140.

The reflection molding portion 290a may cover a portion of the first inside surface 131 on which the second cavity 140 is disposed. The reflection molding portion 290a may extend to the wire bonding portion 160a of the protection device 160 disposed on the bottom surface of the first cavity 130 along the first inside surface 131 of the periphery of the second cavity 140. For example, the reflection molding portion 290a may be disposed along the first inside surface 131 between the second cavity 140 and the first cavity 130.

Here, the wire bonding portion 160a may be disposed on the upper portion surface 170a of the first lead frame 170 exposed to the bottom surface of the first cavity 130 which is closest to the second cavity 140.

The end 291 of the reflection molding portion 290a may be disposed between the wire bonding portion 160a and the first light emitting device 151 and the second emitting device 153. The end 291 of the reflection molding portion 290a may extend from a first boundary 291a between the first inside surface 131 of the first cavity 130 and the end 291 of the reflection molding portion 290a to the bottom surface of the first cavity 131. The end 291 of the reflection molding portion 290a may extend from a second boundary 291b between the fourth inside surface 134 of the first cavity 130 and the end 291 of the reflection molding portion 290a to the bottom surface of the first cavity 130. The end 291 of the reflection molding portion 290a may include a third boundary 291c between the first boundary 291a and the second boundary 291b. The third boundary 291c may be disposed to be parallel to the one side surface 153c of the second light emitting device 153. Here, the one side surface 153s of the second light emitting device 153 may face the first light emitting device 151.

The end 291 of the reflection molding portion 290a between the second boundary 291b and the third boundary 291c may face the one side surface of the first light emitting device 151. Here, the one side surface of the first light emitting device 151 may face the first inside surface 131 on which the protection device 160 is disposed.

The end 291 of the reflection molding portion 290a between the first boundary 291a and the third boundary 291c may face an edge of the second light emitting device 153. However, it is not limited to this. The edge of the second light emitting device 153 may be an edge which faces the protection device 160.

The end 291 of the reflection molding portion 290a may include a fixed width in a first direction X corresponding to the first inside surface 131. For example, the end 291 of the reflection molding portion 290a may include a first width W1 between the first boundary 291a and the second boundary 291b and a second width W2 between the second boundary 291a and the third boundary 291c. Here, the first width W1 may be defined as a distance between a first reference line r1 which extends from the first boundary 291a in a second direction Y which is perpendicular to the first direction X and a second reference line r2 which extends from the second boundary 291b in the second direction Y. The second width W2 may be defined as a distance between the first reference line r1 and a third reference line r3 which extends from the third boundary 291c in the second direction Y.

The reflection molding portion 290a according to the second embodiment may include a second width W2 which is one-third or less of the first width W1. The second embodiment is capable of improving a defect due to contact between the second light emitting device 153 and the reflection molding portion 290a by the second light emitting device 153 and the reflection molding portion 290a being spaced apart from each other by a fixed distance by the second width w2. The reflection molding portion 290a according to the second embodiment may provide a structure which reduces an area of the upper portion surface 170a of the first lead frame 170 exposed from the first cavity 130 and is spaced apart from the first light emitting device 151 and the second light emitting device 153 by a fixed distance. Accordingly, the reflection molding portion 290a according to the second embodiment may improve the light extraction efficiency and improve reliability.

The first light emitting device 151 and the second light emitting device 153 may be disposed in the first cavity 130 and may include a separation distance W3 spaced apart from the reflection molding portion 290a by a fixed distance. For example, the separation distance W3 may 3.3% or less of the bottom surface width of the first cavity 130. Specifically, the separation distance W3 may be between 30 μm and 100 μm. In a case where the separation distance W3 is less than 30 μm, optical efficiency may be reduced by being in contact with the first light emitting device 151 and the second light emitting device 153 and the inside surfaces of the first cavity 130. Further, in a case where the separation distance W3 is less than 30 μm, a yield can be reduced due to defect.

In a case where the separation distance W3 is greater than 100 μm, since an area of the upper portion surface 170a of the first lead frame 170 which is exposed from the first cavity 130 increases, the light extraction efficiency may be reduced due to loss of the light absorbed into the upper portion surface 170a of the first lead frame 170.

The first light emitting device 151 and the second emitting device 153 may different from the distance which is spaced apart from the first inside surface 131 of the first cavity 130. In the second embodiment, the wire bonding portion 160a may be disposed between the first light emitting device 151 and the inside surface of the first cavity 130. In the second embodiment, the separation distance between the first light emitting device 151 and the first inside surface 131 of the first cavity 130 may be greater than the separation distance between the second light emitting device 153 and the first inside surface 131 of the first cavity 130.

The reflection molding portion 290a may include insulating material or reflective material. The reflection molding portion 290a may be made of at least one of polyphthalamide (PPA), poly-cyclo-hecylene dimethyl terephthalate (PCT), white silicone, and white epoxy molding compound (white EMC). However, it is not limited to this.

The reflection molding portion 290a may form on a portion of the bottom surface of the first cavity 130 and the second cavity 140 as a method for dispensing using a nozzle. However, it is not limited to this.

With reference to FIG. 13 to FIG. 17, a boundary portion 131a may be disposed between the second cavity 140 and the first lead frame 170 exposed from the first cavity 130. The boundary portion 131a may be disposed in the first inside surface 131 of the second cavity 130.

An inclined angle θ1 of the first inside surface 131 may be changed according to a position of the boundary portion 131a which is disposed on the spacer 126. For example, in a case where the boundary portion 131a covers the entire of the spacer 126, the first inside surface 131 may include a first inclined angle θ1-1 between the upper surface of the spacer 126 and the first inside surface 131. Further, in a case where the boundary portion 131a covers a portion of the spacer 126, the first inside surface 131 may include a second inclined angle θ1-2 between the upper surface of the spacer 126 and the first inside surface 131. The first inside surface 131 according to the embodiment may include the first inclined angle θ1-1 which is less than the second inclined angle θ1-2. Specifically, in a case where the light emitting device package according to the embodiment has the first inclined angle θ1-1 which is less than the second inclined angle θ1-2, the area of the boundary portion 131a on the spacer 126 is changed and the area of the upper portion surface 170a of the first lead frame 170 which is exposed from the first cavity 130 may be reduced. Accordingly, in a case where the light emitting device package according to the embodiment has a first inclined angle θ1-1 which is less than the second inclined angle θ1-2, the light extraction efficiency is capable of being improved by the first lead frame 170 and the second lead frame 180 hidden by the body 120 having high reflectivity increasing.

Figure 18:
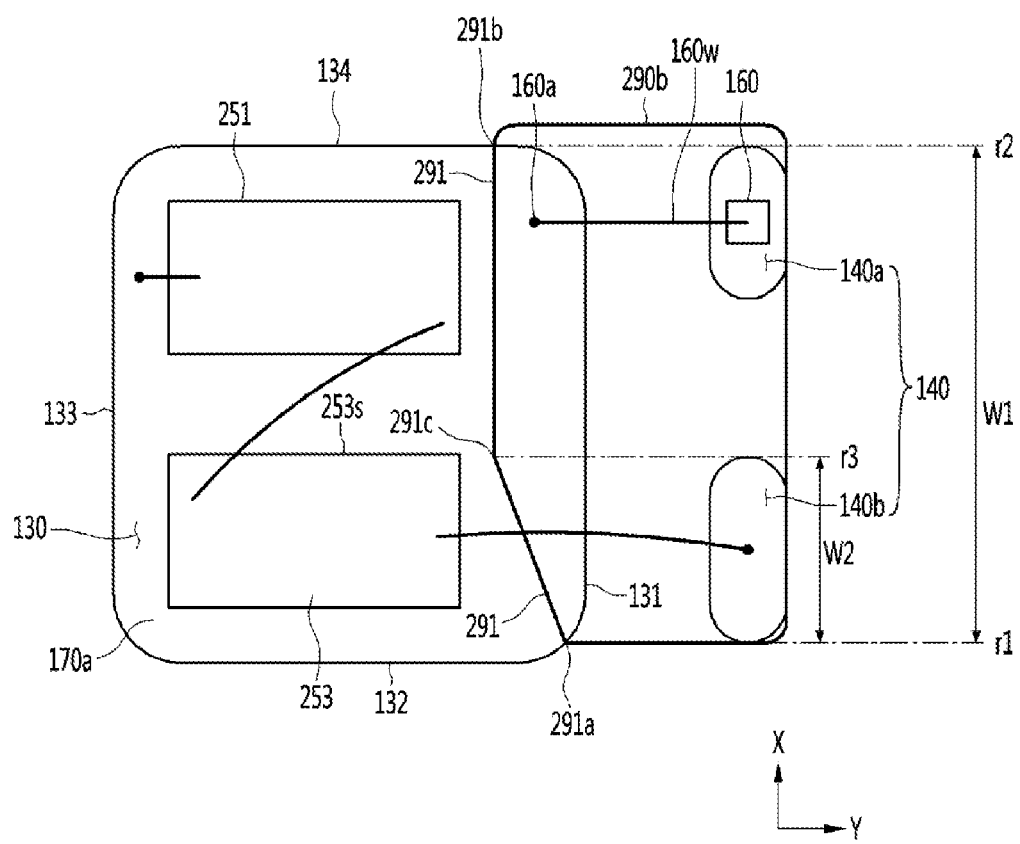

With reference to FIG. 18, a reflection molding portion 290b according to the third embodiment may be disposed on the second cavity 140. A portion of the reflection molding portion 290b may disposed on the upper portion surface 170a of the first lead frame 170 exposed from the first cavity 130. The reflection molding portion 290b may extend to the bottom surface of the first cavity 130 which is closest to the second cavity 140. Accordingly, the reflection molding portions 290b according to the third embodiment may improve the light extraction efficiency by reducing the area of the upper portion surface 170a of the first lead frame which is exposed to the first cavity 130.

In the first light emitting device 251 and the second emitting device 253 according to the third embodiment, the distances which are spaced apart from the first inside surface 131 of the first cavity 130 may be equal to each other. The first light emitting device 251 and the second emitting device 253 may include the separation distance which is spaced apart by a fixed distance between the second to the fourth inside surfaces 132, 133, and 134 of the first cavity 130. For example, the separation distance may 3.3% or less of the bottom surface width of the first cavity 130. The separation distance may adapt technical characteristics of FIG. 13 to FIG. 15.

The reflection molding portion 290b may cover a portion of the first inside surface 131 on which the second cavity 140 is disposed. The reflection molding portion 290b may extend to the wire bonding portion 160a of the protection device 160 disposed on the bottom surface of the first cavity 130 along the first inside surface 131 of the periphery of the second cavity 140. For example, the reflection molding portion 290b may be disposed along the first inside surface 131 between the second cavity 140 and the first cavity 130.

The end 291 of the reflection molding portion 290b may be disposed between the wire bonding portion 160a and the first light emitting device 251 and the second emitting device 253. The end 291 of the reflection molding portion 290a, and the first boundary 291a to the third boundary 291c may adapt the technical characteristics of FIG. 13 to FIG. 15. Further, the first width W1 and the second width W2, material and the manufacturing method of the reflection molding portion 290a may adapt the technical characteristics of FIG. 13 to FIG. 15.

The first boundary 291a may be disposed between the first inside surface 131 and the second inside surface 132 of the first cavity 130.

The second cavity 140 may include the first region 140a on which the protection device 160 is mounted and a second region 140b for wire bonding of the second light emitting device 153. The first region 140a and the second region 140b may be a cavity structure which is spaced apart from each other by a fixed distance. However, it is not limited to this.

Figure 19:
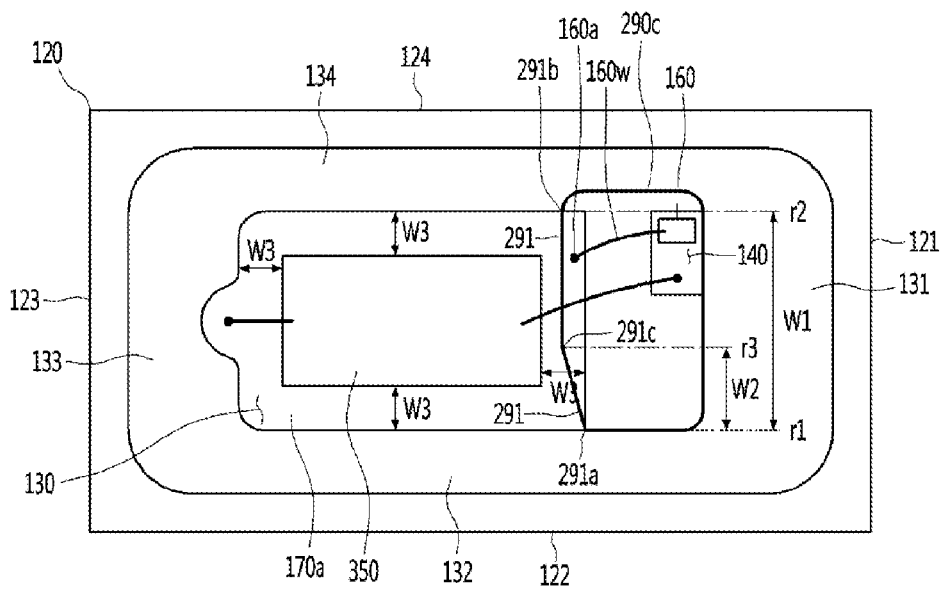

With reference to FIG. 19, a reflection molding portion 290c according to the fourth embodiment may be disposed on the second cavity 140. A portion of the reflection molding portion 290c may disposed on the upper portion surface 170a of the first lead frame 170 exposed from the first cavity 130. The reflection molding portion 290c may extend to the bottom surface of the first cavity 130 which is closest to the second cavity 140. Accordingly, the reflection molding portions 290c according to the fourth embodiment may improve the light extraction efficiency by reducing the area of the upper portion surface 170a of the first lead frame which is exposed to the first cavity 130.

In the fourth embodiment, a light emitting device 350 may be disposed in the first cavity 130. The light emitting device 350 may include a separation distance W3 which is spaced apart by a fixed distance between the first inside surface 131 to the fourth inside surface 134 of the first cavity 130. For example, the separation distance W3 may 3.3% or less of the bottom surface width of the first cavity 130. The separation distance may adapt technical characteristics of FIG. 13 to FIG. 18.

The reflection molding portion 290c may cover a portion of the first inside surface 131 on which the second cavity 140 is disposed. The reflection molding portion 290c may extend to the wire bonding portion 160a of the protection device 160 disposed on the bottom surface of the first cavity 130 along the first inside surface 131 of the periphery of the second cavity 140. For example, the reflection molding portion 290c may be disposed along the first inside surface 131 between the second cavity 140 and the first cavity 130.

The end 291 of the reflection molding portion 290c may be disposed between the wire bonding portion 160a and the light emitting device 253. The end 291 of the reflection molding portion 290c, and the first boundary 291a to the second boundary 291c may adapt the technical characteristics of FIG. 13 to FIG. 18. Further, the first width W1 and the second width W2, material and the manufacturing method of the reflection molding portion 290c may adapt the technical characteristics of FIG. 13 to FIG. 18.

The first boundary 291a may be disposed between the first inside surface 131 and the second inside surface 132 of the first cavity 130.

The protection device 160 may be mounted on the second cavity 140 and the second cavity 140 may include the wire bonding portion of the light emitting device 350. However, it is not limited to this.

Figure 20:
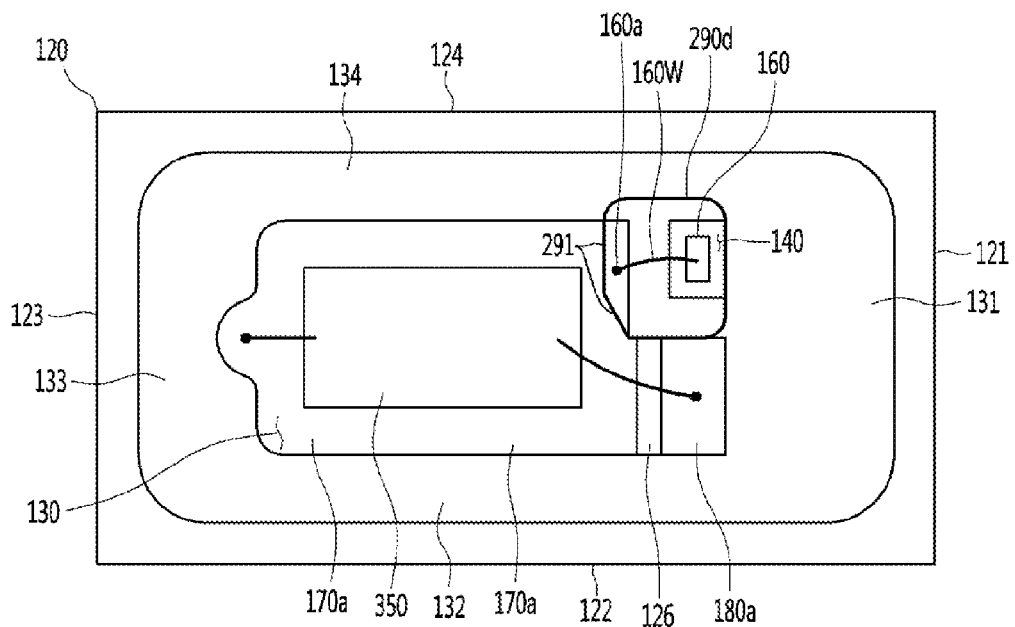

With reference to FIG. 20, a reflection molding portion 290d according to the fifth embodiment may be disposed on the second cavity 140. A portion of the reflection molding portion 290d may disposed on the upper portion surface 170a of the first lead frame 170 exposed from the first cavity 130. The reflection molding portion 290d may extend to the bottom surface of the first cavity 130 which is closest to the second cavity 140. Accordingly, the reflection molding portions 290d according to the fourth embodiment may improve the light extraction efficiency by reducing the area of the upper portion surface 170a of the first lead frame which is exposed to the first cavity 130.

The separation distance between the light emitting device 350 and first cavity 130 and the light emitting device 350 according to the fifth embodiment may adopt technical characteristics of the fourth embodiment in FIG. 19.

The reflection molding portion 290d may cover a portion of the first inside surface 131 on which the second cavity 140 is disposed. The reflection molding portion 290d may extend to the wire bonding portion 160a of the protection device 160 disposed on the bottom surface of the first cavity 130 along the first inside surface 131 of the periphery of the second cavity 140. For example, the reflection molding portion 290d may be disposed along the first inside surface 131 between the second cavity 140 and the first cavity 130.

The end 291 of the reflection molding portion 290d may be disposed between the wire bonding portion 160a and the light emitting device 253. The end 291 of the reflection molding portion 290d and the first boundary to the second boundary may adapt the technical characteristics of FIG. 13 to FIG. 19. Further, the first width and the second width, material and the manufacturing method of the reflection molding portion 290d may adapt the technical characteristics of FIG. 13 to FIG. 19.

In the fifth embodiment, a portion of the spacer may be exposed from the first inside surface 131 of the first cavity 130. For example, the spacer 126 may be exposed between the second inside surface 132 of the first cavity 130 and the second cavity 140 to the outside. Further, in the fifth embodiment, a portion of the upper portion surface 180a of the second lead frame may be exposed from the first inside surface 131 of the cavity 130 to the outside. The wire bonding portion of the light emitting device 350 may be disposed in the upper portion surface 180a of the exposed second lead frame.

Figure 21:
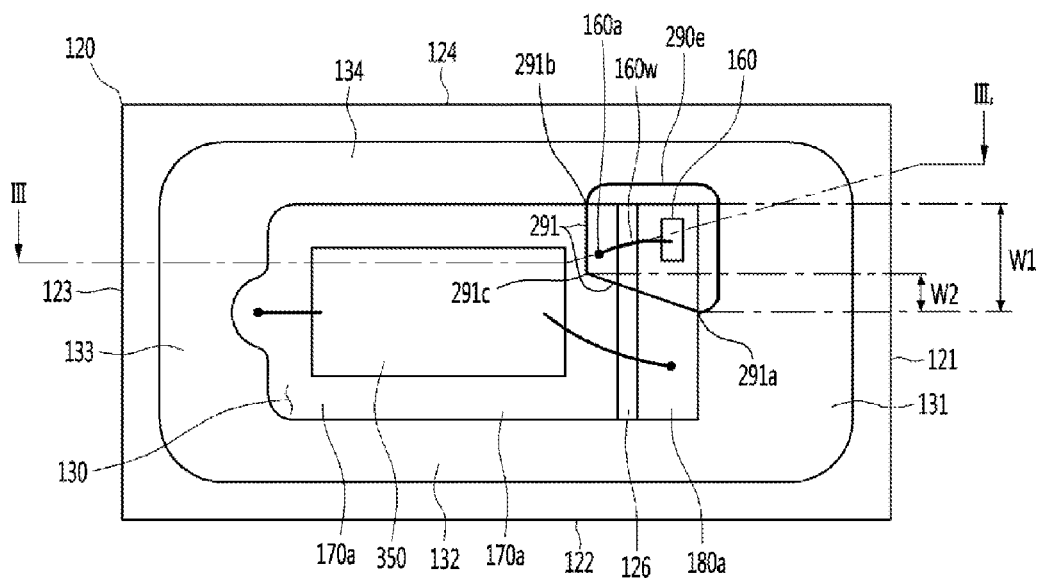
Figure 22:
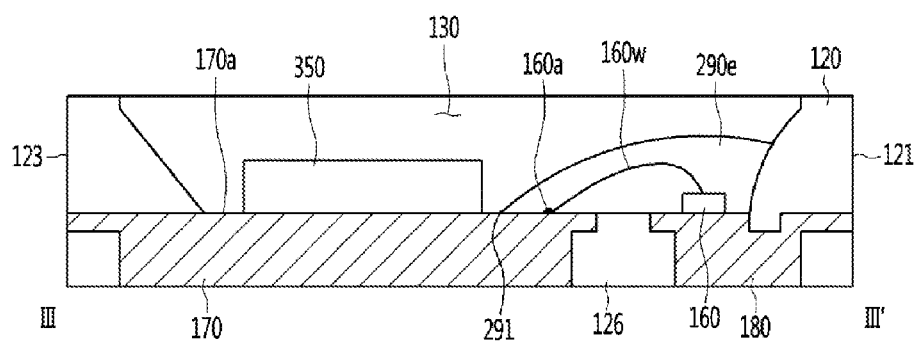

With reference to FIG. 21 and FIG. 22, the reflection molding portion 290e according to the sixth embodiment may be disposed on the protection device 160 and the wire bonding portion 160a. A portion of the reflection molding portion 290e may disposed on the upper portion surface 170a of the first lead frame 170 exposed from the first cavity 130. The reflection molding portion 290e may disposed on the upper portion surface 180a of the second lead frame 180 exposed from the first cavity 130. The reflection molding portion 290e may extend from the upper portion surface 180a of the second lead frame 180 on which the protection device 350 is disposed to the upper portion surface 170a of the first lead frame 170. The reflection molding portions 290e according to the sixth embodiment extend to the upper portion surface 170a of the first lead frame 170 exposed to the first cavity 130 and thus are capable of improving the light extraction efficiency.

The separation distance between the first cavity 130 and the light emitting device 350 according to the sixth embodiment may adapt technical characteristics of the fourth and the fifth embodiments of the FIG. 19 and FIG. 20.

The reflection molding portion 290e may cover the protection device 160 on the upper portion surface 180a of the second lead frame 180 exposed from the first cavity 130 and may cover the wire bonding portion 160a disposed on the upper portion surface 170a of the first lead frame 170.

The end 291 of the reflection molding portion 290e may be disposed between the wire bonding portion 160a and the light emitting device 253. The end 291 of the reflection molding portion 290e and the first boundary to the third boundary may adapt the technical characteristics of FIG. 13 to FIG. 20. Further, the first width and the second width, material and the manufacturing method of the reflection molding portion 290e may adapt the technical characteristics of FIG. 13 to FIG. 20.

In the sixth embodiment, the spacer 126 and the upper portion surface 180a of the second lead frame 180 may be exposed to the bottom of the first cavity 130. For example, the spacer 126 may be exposed between the reflection molding portion 290e and the second inside surface 132 of the first cavity 130 to the outside. Further, in the sixth embodiment, the wire bonding portion of the light emitting device 350 may be disposed in the upper portion surface 180a of the exposed second lead frame 180.

The reflection molding portion 290e may be disposed on the spacer 126. The reflection molding portion 290e may be overlapped with a portion of the spacer 126 in the vertical direction. The reflection molding portion 290e may be directly in contact with the upper portion of the spacer 126.

Figure 23:
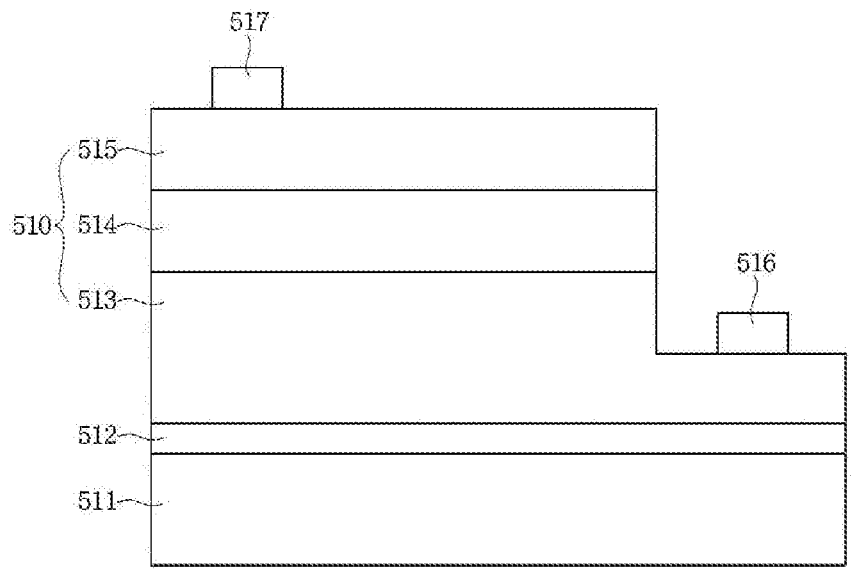
FIG. 23 is a cross-sectional view illustrating a light emitting chip which is included in a light emitting device package according to an embodiment.

FIG. 23 is a cross-sectional view illustrating a light emitting chip which is included in a light emitting device package according to the embodiment.

As illustrated in FIG. 13, the light emitting chip includes a substrate 511, a buffer layer 512, a light emitting structure 510, a first electrode 516 and a second electrode 517. The substrate 511 may be made of light transparent material or non-light transparent material and may include a conductive substrate or an insulating substrate.

The buffer layer 512 reduces a lattice constant difference between material of the substrate 512 and material of the light emitting structure 510 and may be made of a nitride semiconductor. A nitride semiconductor layer which is not doped with dopant is further formed between the buffer layer 512 and the light emitting structure 510 and thus can improve crystal quality.

The light emitting structure 510 include a first conductive semiconductor layer 513, an active layer 514, and a second conductive semiconductor layer 515.

For example, It may be implemented with compound semiconductors, such as group II-group IV and group III-group V. The first conductive semiconductor layer 513 may be formed in a single layer or multi-layers. The first conductive semiconductor layer 513 may be doped with a first conductive dopant. For example, in a case where the first conductive semiconductor layer 513 is an n-type semiconductor layer, it may include a n-type dopant. For example, the n-type dopant may include Si, Ge, Sn, Se, and Te. However, it is not limited to this. The first conductive semiconductor layer 513 may include a composition formula of InxAlyGa1-x-yN (0≤x≤1, 0≤y≤1, 0≤x+y≤1). The first conductive semiconductor layer 513 may include a stacked structure of layers including at least one of compound semiconductors such as GaN, InN, AlN, InGaN, AlGaN, InAlGaN, AlInN, AlGaAs, GaP, GaAs, GaAsP, and AlGaInP, for example.

A first cladding layer may be formed between the first conductive semiconductor layer 513 and the active layer 514. The cladding layer may be formed in a GaN-based semiconductor and a band gap of the cladding layer may be equal to or greater than the band gap of the active layer 514. This first cladding layer may be a first conductivity type and may include ability to constrain a carrier.

The active layer 514 is disposed on the first conductive semiconductor layer 513 and may selectively include a single quantum well, multiple quantum wells (MQW), quantum wire structure, or a quantum dot structure. The active layer 514 may include a cycle of well layer and barrier layer. The well layer may include a composition formula of InxAlyGa1-x-yN (0≤x≤1, 0≤y≤1, 0≤x+y≤1) and the barrier layer may include a composition formula of InxAlyGa1-x-yN (0≤x≤1, 0≤y≤1, 0≤x+y≤1). The cycle of the well layer and the barrier layer may be formed in at least one cycle using stacked structures of InGaN/GaN, GaN/AlGaN, InGaN/AlGaN, InGaN/InGaN, and InAlGaN/InAlGaN, for example. The barrier layer may be formed in semiconductor material having a band gap which is higher than a band gap of the well layer.

The second conductive semiconductor layer 515 is formed on the active layer 514. The second conductive semiconductor layer 515 may be implemented with compound semiconductors, such as compound semiconductors of group II-group IV and group III-group V. The second conductive semiconductor layer 515 may be formed in a single layer or multi-layers. In a case where the second conductive semiconductor layer 515 is a p-type semiconductor layer, the second conductive dopant may include Mg, Zn, Ca, Sr, Ba, or the like, as a p-type dopant. The second conductive semiconductor layer 515 may be doped with a second conductive dopant. The second conductive semiconductor layer 515 may include a composition formula of InxAlyGa1-x-yN (0≤x≤1, 0≤y≤1, 0≤x+y≤1). The second conductive semiconductor layer 515 may be made of any one of compound semiconductors such as GaN, InN, AlN, InGaN, AlGaN, InAlGaN, AlInN, AlGaAs, GaP, GaAs, GaAsP, and AlGaInP, for example.

The second conductive semiconductor layer 515 may include a super-lattice structure and the super-lattice structure may include an InGaN/GaN super-lattice structure or an AlGaN/GaN super-lattice structure. The super-lattice structure of the second conductive semiconductor layer 515 may protect the active layer 514 by diffusing a current which is abnormally included in voltage.

Even if the first conductive semiconductor layer 513 is described as a n-type semiconductor layer and the second conductive semiconductor layer 515 is described as a p-type semiconductor layer, the first conductive semiconductor layer 513 is described as a p-type semiconductor layer and the second conductive semiconductor layer 515 is described as a n-type semiconductor layer. However, it is not limited to this. A semiconductor having a polarity opposite to the polarity of the second conductivity type, for example n-type semiconductor layer (not illustrated) may be formed on the second conductive semiconductor layer 515. According to this, the light emitting structure 510 may be implemented as any one structure among an n-p junction structure, a p-n junction structure, a n-p-n junction structure, and a p-n-p junction structure.

A first electrode 516 is disposed on the first conductive semiconductor layer 513 and a second electrode 517 having a current diffusion layer is included on the second conductive semiconductor layer 513.

Figure 24:
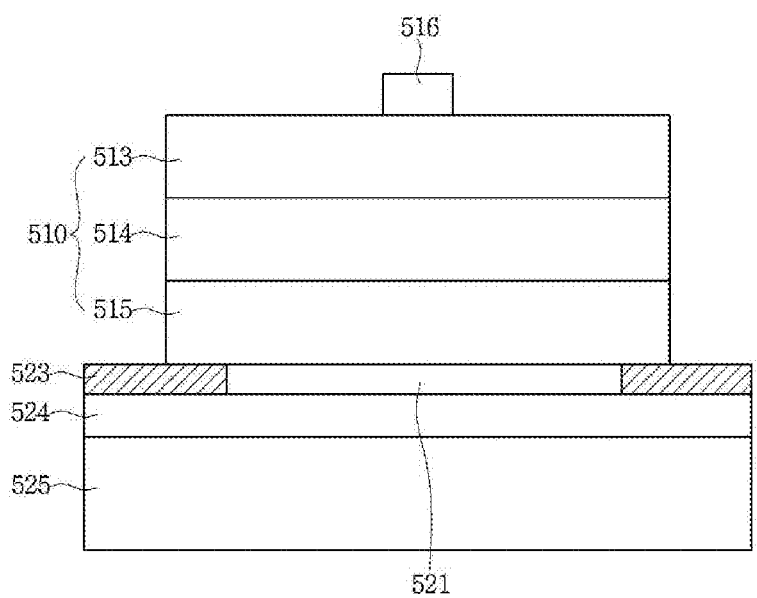
FIG. 24 is a cross-sectional view illustrating another example of a light emitting chip which is included in a light emitting device package according to an embodiment.

FIG. 24 is a cross-sectional view illustrating another example of a light emitting chip which is included in a light emitting device package according to an embodiment. As illustrated in FIG. 24, a light emitting chip of another example refers to FIG. 6. Therefore, description of the same configuration will be omitted. As an light emitting chip according to another example, a contacting layer 521 may be disposed under the light emitting structure 510, a reflective layer 524 may be disposed under the contacting layer 521, a supporting member 525 may be disposed under the reflective layer 524, and a protection layer 523 may be disposed around the light emitting structure 510 and the reflective layer 524.

The light emitting chip may be disposed the contacting layer 521 and the protection layer 523, the reflective layer 524 and the supporting member 525 under the second conductive semiconductor layer 515.

The contacting layer 521 may have an ohmic contact with a lower surface of the light emitting structure 510, for example the second conductive semiconductor layer 515. The contacting layer 521 may be selected among metal nitride, an insulating material, and a conductive material. For example, the contacting layer 521 may be formed among materials consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf and a selective combination thereof. Further, the contacting layer may be formed in the multilayer using metal material and light transmissive and conductive material such as IZO, IZTO, IAZO, IGZO, IGTO, AZO, ATO and may be stacked with IZO/Ni, AZO/Ag, IZO/Ag/Ni, AZO/Ag/Ni, for example. A current blocking layer which blocks current to correspond to the electrode 615 may further formed in the contacting layer 521.

The protection layer 523 may be selected among metal oxide and an insulating material. For example, the protecting layer 523 may be selectively formed among materials consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), SiO2, SiOx, SiOxNy, Si3N4, Al2O3, and TiO2. The protection layer 523 may be formed by using a sputtering method, the vapor deposition method, or the like. Metal such as the reflection layer 524 can prevent layers of the light emitting structure 510 to be short-circuited.

The reflective layer 524 may include metal. For example, the reflective layer 524 may be formed in Ag, Ni, Al, Rh, Pd, Ir, Ru, Mg, Zn, Pt, Au, Hf and material consisting of a selective combination thereof. The reflective layer 524 is capable of improving light reflection efficiency by the width thereof being formed to be greater than the width of the light emitting structure 510. A metal layer for bonding, a metal layer for thermal diffusion may be further disposed between the reflective layer 524 and the supporting member 525. However it is not limited to this.

The supporting member 525 may be implemented with metal such as Copper (Cu), gold (Au), nickel (Ni), molybdenum (Mo), copper-tungsten (Cu—W) or a carrier wafer (for example: Si, Ge, GaAs, ZnO, SiC) as a base substrate. A bonding layer may be further formed between the supporting member 525 and the reflective layer 524.

<Lighting System>

Figure 25:
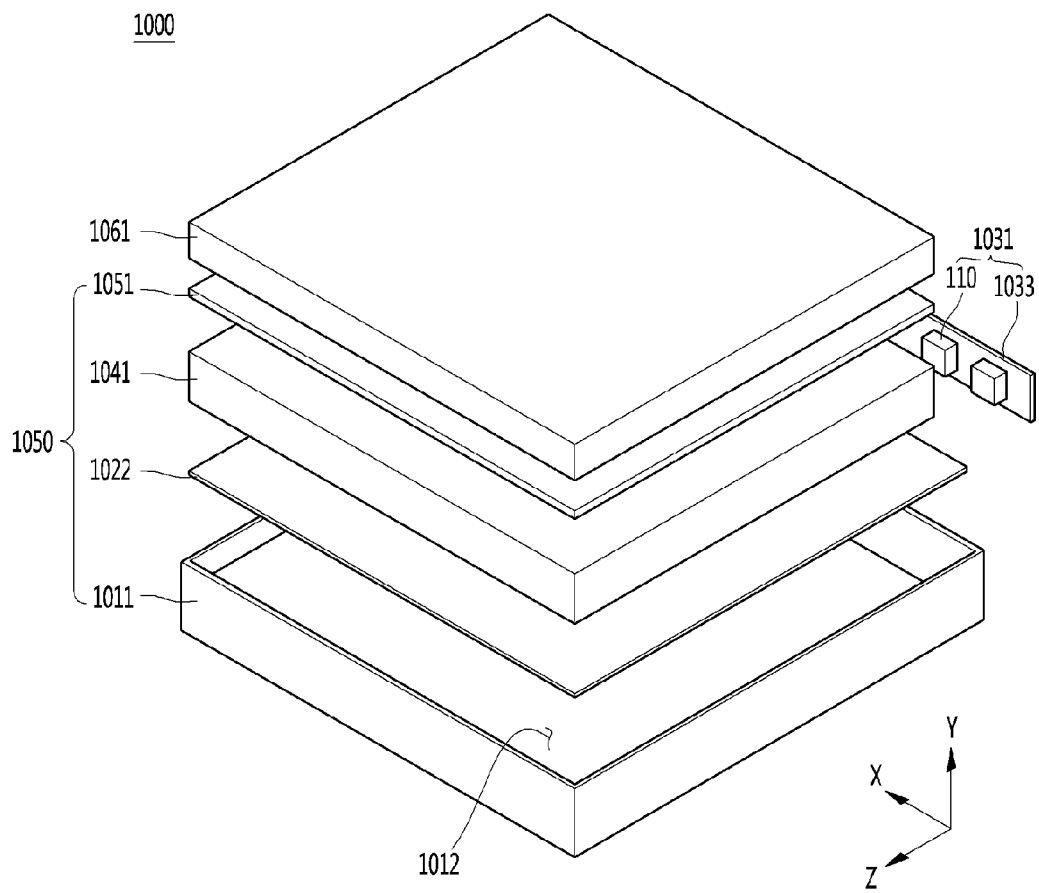
FIG. 25 is a perspective view illustrating a display device which includes a light emitting device package according to an embodiment.

FIG. 25 is a perspective view illustrating a display device which includes a light emitting device package according to an embodiment.

As illustrated in FIG. 25, a display apparatus 1000 according to the embodiment may include a light guide plate 1041, a light source module 1031 which provide light to the light guide plate 1041, a reflection member 1022 under the light guide plate 1041, an optical sheet 1051 on the light guide plate 1041, a display panel 1061 on the optical sheet 1051, and a bottom cover 1011 which accommodates the light guide plate 1041, the light source module 1031, and the reflection member 1022. However, it is not limited to this.

The bottom cover 1011, the reflection member 1022, the light guide plate 1041, and the optical sheet 1051 may be defined as a light unit 1050.

The light guide plate 1041 serves to diffuse the light and thus to be a surface light source. The light guide plate 1041 may be made of transparent material and may include one of acrylic resin based material such as polymethyl metaacrylate (PMMA) and resin such as polyethylene terephthlate (PET), poly carbonate (PC), cycloolefin copolymer (COC) and polyethylene naphthalate (PEN).

The light source module 1031 provides light on at least one side surface of the light guide plate 1041 and ultimately acts as a light source of the display device.

At least one light source module 1031 may be provided and may directly or indirectly provide light from a side surface of the light guide plate 1041. The optical module 1031 include a substrate 1033 and the light emitting device package 110 according to the embodiment and a plurality of light emitting device packages 110 may be disposed on the substrate 1033 in a state of being spaced apart from each other by a fixed distance.

The substrate 1033 may be a printed circuit board (PCB) including a circuit pattern (not illustrated). However, the substrate 1033 may includes a general PCB as well as a metal core PCB (MCPCB), a flexible PCB (FPCB), or the like. However, it is not limited to this. The light emitting device package 110 may be directly disposed on a side surface of the bottom cover 1011 or a heat dissipation plate.

The reflection member 1022 may be disposed under the light guide plate 1041. The reflection member 1022 is capable of improving the brightness of the light unit 1050 by reflecting light which is incident on a lower surface of the light guide plate 1041. The reflection member 1022 may be made of PET, PC, PVC resin, or the like, for example. However, it is not limited to this.

The bottom cover 1011 may accommodates the light guide plate 1041, the light source module 1031, the reflection member 1022, or the like. The bottom cover 1011 may include an accommodating portion 1012 having a box shape of which an upper surface is opened. However, it is not limited to this. The bottom cover 1011 may couple with a top cover. However, it is not limited to this.

The bottom cover 1011 may be made of metal material or resin material and may be manufactured using a process such as press molding, extrusion molding. In addition, the bottom cover 1011 may include metallic or non-metallic materials having good thermal conductivity. However, it is not limited to this.

The display panel 1061, for example, as a LCD panel, may include a first substrate and a second substrate which are transparent and face each other, and a liquid crystal layer which is inserted between the first substrate and the second substrate. A polarizing plate may be disposed on at least one surface of the display panel 1061. The display panel 1061 displays information by light passed through the optical sheet 1051. The display device 1000 can be applied to various types of portable terminals, a monitor of a notebook computer, a monitor of a laptop computer, a television, or the like.

The optical sheet 1051 may be disposed between the display panel 1061 and the light guide plate 1041. The optical sheet 1051 may include at least one transparent sheet. The optical sheet 1051 may include at least one among a diffusion sheet, at least one of prism sheet, and the protection sheet. The diffusion sheet may include a function which diffuses light which is incident. The diffusion sheet may include a function which condenses light which is incident into a display area. The protection sheet may include a function which protects the prism sheet.

<Lighting System>

Figure 26:
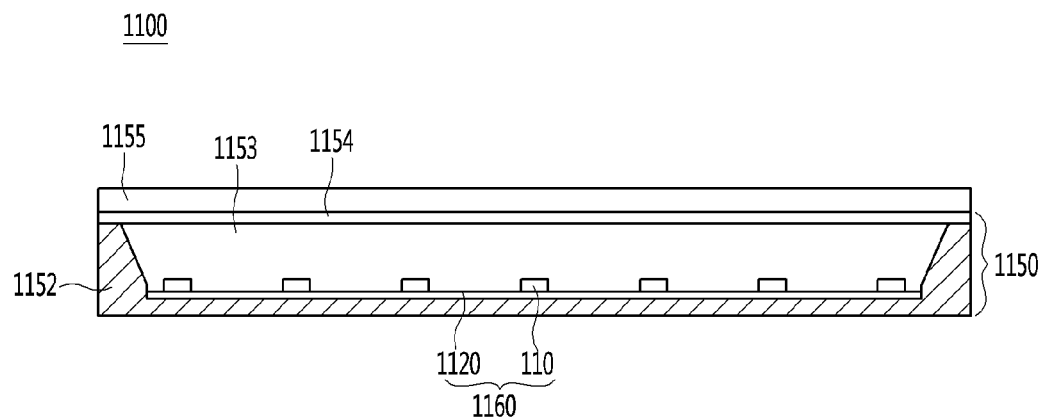
FIG. 26 is a cross-sectional view illustrating another example of a display device which includes a light emitting device package according to an embodiment.

FIG. 26 is a cross-sectional view illustrating another example of a display device which includes a light emitting device package according to an embodiment.

As illustrated in FIG. 26, a display device 1100 of another example may include a bottom cover 1152, a substrate 1120 on which the light emitting device package 110 is mounted, an optical member 1154, and a display panel 1155.

The substrate 1120 and the light emitting device package 110 may be defined as a light source module 1160. The bottom cover 1152, at least one light source module 1160, and an optical member 1154 may be defined as a light unit 1150. The bottom cover 1152 may include an accommodating portion 1153. However, it is not limited to this. The light source module 1160 may include a substrate 1120 and a plurality of light emitting device package 110 which is disposed on the substrate 1120.

Here, the optical member 1154 may include at least one of lens, a diffusion plate, a diffusion sheet, a prism sheet, and a protective sheet. The diffusion plate may be made of PC material or poly methyl methacrylate (PMMA) material and the diffusion plate may be removed. The diffusion sheet may diffuse incident light, the prism sheet may condense the incident light into a display area, and the protection sheet may protect the prism sheet.

The optical member 1154 is disposed on the light source module 1060, is to be surface light source using light emitted from the light source module 1060 and performs diffusion, condensation, or the like of the light emitted from the light source module 1060.

The light emitting device package 110 according to the embodiment may be applied to the display device as well as lighting units, indication units, lamps, street lights, vehicle lighting devices, vehicle display devices, smart watches, or the like. However, it is not limited to this.

Features, structures, effects or the like which are described in the above embodiments are included in at least one embodiment and it is not necessarily limited to only one embodiment. Further, features, structures, effects, or the like described in each embodiment can be carried out in combination or modification for other embodiments by those having ordinary skill in the art belonging to the embodiments. Therefore, contents related to such combinations and modifications should be construed as being included in the scope of the embodiments.

It is described with reference to the embodiments above, but it is illustrative only and is not intended to limit the embodiments. Those of ordinary skill in the art belonging to the embodiments will recognize that various modifications and applications which are not illustrated in the above embodiments are possible without departing from the essential characteristics of this embodiment. For example, each component which is specifically described in the embodiment can be modified and performed. Differences relating to these modifications and applications should be construed as being included in the scope of the embodiments set out in the appended claims.

What is claimed is:
1. A light emitting device package, comprising:
a first lead frame;
a second lead frame spaced apart from the first lead frame;
a body on the first lead frame and the second lead frame;
a light emitting device disposed on the first lead frame;
a protection device disposed on the second lead frame; and
a reflection molding portion on the protective device,
wherein the body includes a first cavity which exposes a first portion of an upper surface of the first lead frame,
wherein the first light emitting device is disposed in the first cavity,
wherein the first cavity includes a first inside surface and a second inside surface facing to each other, and a third inside surface and a fourth inside surface facing to each other,
wherein the third inside surface and the fourth inside surface are connected to the first inside surface,
wherein the reflection molding portion is disposed on the first inside surface,
wherein a portion of the reflection molding portion extends to the upper surface of the first lead frame, wherein a first boundary part of the reflection molding portion is located between the first inside surface of the first cavity and a first end of the reflection molding portion,
wherein a second boundary part of the reflection molding portion is located between the fourth inside surface of the first cavity and a second end of the reflection molding portion,
wherein a third boundary part of the reflection molding portion is connected between the first boundary part and the second boundary part, and
wherein an area of the first portion exposed to the first cavity in the upper surface of the first lead frame is equal to or less than 40% of entire area of the body.

2. The light emitting device package of claim 1, wherein the protective device is disposed in the first inside surface of the first cavity.

3. The light emitting device package of claim 1, wherein the protective device is disposed in a second cavity of the first inside surface, and
wherein an upper portion of the second cavity is opened from the first inside surface.

4. The light emitting device package of claim 1, wherein the third boundary part of the reflection molding portion is disposed on the first portion of the upper surface of the first lead frame.

5. The light emitting device package of claim 1, wherein the first, second, third and fourth inside surfaces of the first cavity is disposed along an edge of the upper surface of the first lead frame.

6. The light emitting device package of claim 1, wherein the third boundary part of the reflection molding portion is disposed between a first side surface of the light emitting device and the first inside surface of the first cavity, and
wherein the first side surface of the light emitting device faces to the first inside surface of the first cavity.

7. The light emitting device package of claim 1, wherein the third boundary part of the reflection molding portion is disposed to be parallel to the first side surface of the light emitting device.

8. The light emitting device package of claim 1, wherein the reflection molding portion is overlapped with the first inside surface and the fourth inside surface of the first cavity in a vertical direction.

9. The light emitting device package of claim 8, wherein the reflection molding portion is overlapped with the first lead frame and the second frame in the vertical direction.

10. The light emitting device package of claim 1, wherein a spacer is disposed between the first and second lead frames, and
wherein the first inside surface of the first cavity is disposed on an upper surface of the spacer.

11. The light emitting device package of claim 1, wherein a spacer is disposed between the first and second lead frames, and
wherein the portion of the reflection molding portion extends to an upper surface of the spacer.

12. The light emitting device package of claim 1, wherein a distance between the light emitting device and the reflection molding portion on a bottom surface of the first cavity is 3.3% or less of a width of the bottom surface of the first cavity.

13. The light emitting device package of claim 12, wherein the distance is between the 30 μm and 100 μm.

14. A light emitting device package, comprising:
a first lead frame;
a second lead frame spaced apart from the first lead frame;
a body on the first lead frame and the second lead frame;
a spacer between the first lead frame and the second lead frame;
a light emitting device disposed on the first lead frame;
a protection device disposed on the second lead frame; and
a reflection molding portion on the protective device,
wherein the body includes a first cavity which exposes a first portion of an upper surface of the first lead frame,
wherein the first light emitting device is disposed in the first cavity,
wherein the first cavity includes a first inside surface and a second inside surface facing to each other, and a third inside surface and a fourth inside surface facing to each other,
wherein the third inside surface and the fourth inside surface are connected to the first inside surface,
wherein the reflection molding portion is disposed on the first inside surface and the spacer,
wherein a portion of the reflection molding portion extends to the upper surface of the first lead frame which expose to a bottom of the first cavity,
wherein the reflection molding portion covers an entire area of an upper surface of the spacer, and
wherein an area of the first portion exposed to the first cavity in the upper surface of the first lead frame is equal to or less than 40% of entire area of the body.

15. The light emitting device package of claim 14, wherein the first inside surface includes a boundary portion between the light emitting device and a second cavity, and
wherein the boundary portion has a height greater than a height of the protective device.

16. The light emitting device package of claim 15, wherein the protective device is disposed in the first inside surface of the first cavity.

17. The light emitting device package of claim 15, wherein the protective device is disposed in the second cavity of the first inside surface.

18. The light emitting device package of claim 15, wherein the first inside surface is inclined at a same angle as an upper surface of the boundary portion.

19. The light emitting device package of claim 18, wherein the second, third and fourth inside surfaces of the first cavity and the reflection molding portion are disposed along an edge of the upper surface of the first lead frame.

20. The light emitting device package of claim 14, wherein a distance between the light emitting device and the reflection molding portion on a bottom surface of the first cavity is 3.3% or less of a width of the bottom surface of the first cavity.

* * * * *